(12) United States Patent
Ikedo et al.

(10) Patent No.: US 10,971,897 B2
(45) Date of Patent: Apr. 6, 2021

(54) SEMICONDUCTOR LASER DEVICE, SEMICONDUCTOR LASER MODULE, AND LASER LIGHT SOURCE SYSTEM FOR WELDING

(71) Applicant: Panasonic Intellectual Property Management Co., Ltd., Osaka (JP)

(72) Inventors: Norio Ikedo, Toyama (JP); Tougo Nakatani, Toyama (JP); Takahiro Okaguchi, Toyama (JP); Takeshi Yokoyama, Toyama (JP); Tomohito Yabushita, Toyama (JP); Toru Takayama, Toyama (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 0 days.

(21) Appl. No.: 16/234,344

(22) Filed: Dec. 27, 2018

(65) Prior Publication Data

US 2019/0131770 A1 May 2, 2019

Related U.S. Application Data

(63) Continuation of application No. PCT/JP2017/018441, filed on May 17, 2017.

(30) Foreign Application Priority Data

Jun. 30, 2016 (JP) .............................. JP2016-130584

(51) Int. Cl.
*H01S 5/16* (2006.01)
*B23K 26/21* (2014.01)
(Continued)

(52) U.S. Cl.
CPC ............ *H01S 5/16* (2013.01); *B23K 26/0608* (2013.01); *B23K 26/21* (2015.10); *B23K 26/703* (2015.10);
(Continued)

(58) Field of Classification Search
CPC .... H01S 5/2031; H01S 5/1014; H01S 5/1003; H01S 5/162; H01S 5/1064
See application file for complete search history.

(56) References Cited

U.S. PATENT DOCUMENTS 7,839,911 B2 * 11/2010 Satoh ..................... B82Y 20/00
372/43.01
2003/0057427 A1 3/2003 Chida
(Continued)

FOREIGN PATENT DOCUMENTS

JP H09-321379 A 12/1997
JP 2011-151238 A 8/2011
(Continued)

OTHER PUBLICATIONS

International Search Report (ISR) and Written Opinion issued in International Application No. PCT/JP2017/018441 dated Jul. 11, 2017.

*Primary Examiner* — Tod T Van Roy
*Assistant Examiner* — Delma R Fordé
(74) *Attorney, Agent, or Firm* — McDermott Will & Emery LLP

(57) ABSTRACT

A semiconductor laser device includes: a first conductivity side semiconductor layer, an active layer; and a second conductivity side semiconductor layer. The second conductivity side semiconductor layer includes a first semiconductor layer and a second semiconductor layer, the first semiconductor layer being closer to the active layer than the second semiconductor layer is. The second semiconductor layer defines a width of a current injection region for injecting current into an optical waveguide. The current injection region includes a width varying region in which a width varies. S1>S2, where S1 denotes a width of the width
(Continued)

varying region on a front end face side, and S2 denotes a width of the width varying region on a rear end face side.

19 Claims, 23 Drawing Sheets

(51) Int. Cl.
  *B23K 26/06* (2014.01)
  *B23K 37/00* (2006.01)
  *H01S 5/10* (2021.01)
  *B23K 26/70* (2014.01)
  *H01S 5/042* (2006.01)
  *H01S 5/343* (2006.01)
  *H01S 5/20* (2006.01)

(52) U.S. Cl.
  CPC .......... *B23K 37/003* (2013.01); *H01S 5/0421* (2013.01); *H01S 5/1003* (2013.01); *H01S 5/1014* (2013.01); *H01S 5/1064* (2013.01); *H01S 5/162* (2013.01); *H01S 5/343* (2013.01); *H01S 5/20* (2013.01); *H01S 5/2031* (2013.01)

(56) References Cited

U.S. PATENT DOCUMENTS

| | | | | |
|---|---|---|---|---|
| 2005/0157767 A1* | 7/2005 | Watanabe | .............. | B82Y 20/00 372/43.01 |
| 2007/0127532 A1* | 6/2007 | Murasawa | ................ | H01S 5/22 372/46.01 |
| 2009/0034573 A1* | 2/2009 | Takayama | .............. | B82Y 20/00 372/49.01 |
| 2010/0124244 A1* | 5/2010 | Higuchi | ................ | G11B 7/127 372/45.01 |
| 2010/0290496 A1* | 11/2010 | Takayama | ................ | H01S 5/22 372/46.012 |
| 2011/0206082 A1* | 8/2011 | Ohki | .................... | H01S 5/02284 372/46.01 |
| 2011/0211608 A1 | 9/2011 | Fujimoto et al. | | |
| 2011/0261854 A1* | 10/2011 | Sasaoka | .................... | H01S 5/16 372/45.011 |
| 2013/0044781 A1* | 2/2013 | Taniguchi | .............. | B82Y 20/00 372/45.01 |
| 2014/0064311 A1* | 3/2014 | Eichler | ................ | H01S 5/2218 372/45.01 |
| 2014/0294028 A1* | 10/2014 | Shigihara | .............. | H01S 5/2027 372/45.01 |
| 2015/0063392 A1* | 3/2015 | Takayama | .............. | B82Y 20/00 372/45.01 |
| 2015/0349495 A1* | 12/2015 | Kinugawa | .............. | H01S 5/162 438/31 |
| 2017/0063046 A1* | 3/2017 | Fukagai | ............ | H01S 5/04254 |
| 2017/0149214 A1* | 5/2017 | Taniguchi | ............ | H01S 5/4031 |
| 2018/0323579 A1* | 11/2018 | Kaji | ...................... | H01S 5/4012 |
| 2020/0006921 A1* | 1/2020 | Ikedo | .................... | B23K 26/24 |

FOREIGN PATENT DOCUMENTS

| | | |
|---|---|---|
| JP | 5261857 B2 | 8/2013 |
| JP | 5661220 B2 | 1/2015 |
| WO | 2010/050071 A1 | 5/2010 |

* cited by examiner

*LENGTH L OF RESONATOR = 6 mm
*CENTER OF RESONATOR IS SET AS POSITION 0 INSIDE RESONATOR

| R1 (%) | R2 (%) | R1/R2 RATIO | FIELD INTENSITY X ON FRONT END FACE X | FIELD INTENSITY X ON REAR END FACE Y | X/Y |
|---|---|---|---|---|---|
| 0.1 | 95 | 0.0010 | 5.70 | 0.18 | 32.44 |
| 0.2 |  | 0.0021 | 4.79 | 0.21 | 22.94 |
| 2 |  | 0.021 | 2.69 | 0.37 | 7.254 |
| 15 |  | 0.157 | 1.63 | 0.61 | 2.649 |
| 32 |  | 0.336 | 1.35 | 0.74 | 1.81 |

* LENGTH L OF RESONATOR = 6 mm

THRESHOLD CURRENT: 21.0 (A)
SLOPE EFFICIENCY: 1.14 (W/A)
(AVERAGE SLOPE EFFICIENCY@20W-100W)

THRESHOLD CURRENT: 11.9 (A)
SLOPE EFFICIENCY: 1.21 (W/A)
(AVERAGE SLOPE EFFICIENCY@20W-100W)

THRESHOLD CURRENT: 12.9 (A)
SLOPE EFFICIENCY: 1.24 (W/A)
(AVERAGE SLOPE EFFICIENCY@20W-100W)

LIGHT LOSS α = 0.4 cm⁻¹

SEMICONDUCTOR LASER DEVICE, SEMICONDUCTOR LASER MODULE, AND LASER LIGHT SOURCE SYSTEM FOR WELDING

CROSS REFERENCE TO RELATED APPLICATIONS

This application is a U.S. continuation application of PCT International Patent Application No. PCT/JP2017/018441 filed on May 17, 2017, claiming the benefit of priority of Japanese Patent Application Number 2016-130584 filed on Jun. 30, 2016, the entire contents of which are hereby incorporated by reference.

BACKGROUND

1. Technical Field

The present disclosure relates to, for instance, a semiconductor laser device, a semiconductor laser module which includes the semiconductor laser device, and a laser light source system for welding which includes the semiconductor laser device.

2. Description of the Related Art

Semiconductor laser devices are used in welding light sources, projector light sources, display light sources, illumination light sources, and light sources of other devices such as electronic devices and information processing devices.

Conventionally, the configuration disclosed in WO 2010/050071 has been known as a configuration of a semiconductor laser device of this kind. The following describes a conventional semiconductor laser device disclosed in WO 2010/050071, with reference to FIGS. 22A and 22B. FIG. 22A is a cross-sectional view of conventional semiconductor laser device 10 disclosed in WO 2010/050071, and FIG. 22B is a distribution map of band gaps of layers in conventional semiconductor laser device 10.

As illustrated in FIG. 22A, conventional semiconductor laser device 10 includes: substrate 19; lower cladding layer 15 disposed above substrate 19; guiding layer 14 disposed above lower cladding layer 15; barrier layer 13 (n-type barrier layer) disposed above guiding layer 14; active layer 11 disposed above barrier layer 13; upper cladding layer 12 disposed above active layer 11; first contact layer 17 disposed above upper cladding layer 12; current blocking layer 16 having a stripe-shaped opening and disposed above first contact layer 17; and second contact layer 18 covering the opening of current blocking layer 16, and disposed above current blocking layer 16.

As illustrated in FIG. 22B, the band gap of barrier layer 13 adjacent to active layer 11 is greater than the band gaps of active layer 11, guiding layer 14, and lower cladding layer 15. Furthermore, the refractive index of lower cladding layer 15 is greater than the refractive index of upper cladding layer 12.

Such a configuration allows electrons resulting from carrier overflow caused by an increase in the temperature of active layer 11 made by injection of high driving current to pass through barrier layer 13 and to be efficiently injected into active layer 11. Furthermore, light which has spread over guiding layer 14 is a waveguide mode and a light intensity on an end face from which emitted light exits decreases, and thus occurrence of catastrophic optical damage (COD) on the end face can be inhibited.

SUMMARY

There has been a demand for a higher-output semiconductor laser device that can be driven at a low voltage. However, it is difficult to achieve a higher-output semiconductor laser device that can be driven at a low voltage while inhibiting the occurrence of COD by merely controlling the band gap of barrier layer 13 as attempted by conventional semiconductor laser device 10 described above.

An object of the present disclosure is to provide a high-output semiconductor laser device that can be driven at a low voltage while inhibiting the occurrence of COD, a semiconductor laser module, and a laser light source system for welding.

In order to achieve the above object, a semiconductor laser device according to an aspect of the present disclosure is a semiconductor laser device which produces multi-transverse mode oscillation, and includes: a stacked structure in which a first conductivity side semiconductor layer, an active layer, and a second conductivity side semiconductor layer are stacked in stated order. The stacked structure includes: a front end face from which laser light emitted by the semiconductor laser device exits; a rear end face opposite the front end face; and an optical waveguide for which the front end face and the rear end face are used as reflection mirrors of a resonator. The second conductivity side semiconductor layer includes a first semiconductor layer and a second semiconductor layer, the first semiconductor layer being closer to the active layer than the second semiconductor layer is. The second semiconductor layer defines a width of a current injection region for injecting current into the optical waveguide. End portions of the current injection region in a lengthwise direction of the resonator are located on an inner side relative to the front end face and the rear end face. The current injection region includes a width varying region in which a width varies. S1>S2, where S1 denotes a width of the width varying region on a front end face side closer to the front end face, and S2 denotes a width of the width varying region on a rear end face side closer to the rear end face.

Accordingly, since the semiconductor laser device produces multi-transverse mode oscillation, the semiconductor laser device can produce high-output laser oscillation which cannot be achieved by a semiconductor laser device which produces single mode oscillation, and also can be driven at a low voltage by increasing utilization efficiency of injected carriers. Moreover, in the semiconductor laser device which produces multi-transverse mode oscillation, when current is injected only in a linear region having a constant width in the longitudinal direction of the optical waveguide (lengthwise direction of the resonator), light density is high in a region near the front end face (end face from which emitted light exits) in particular, in the lengthwise direction of the resonator within the optical waveguide, so that COD occurs on the front end face. As in the present disclosure, the current injection region includes the width varying region which satisfies S1>S2, and thus light intensity is spread and made even in the transverse direction as closer to the front end face, and also light density on end faces can be decreased, so that the occurrence of COD on the front end face can be inhibited. Accordingly, a high-output semiconductor laser device which can be driven at a low voltage while inhibiting occurrence of COD can be achieved.

In the semiconductor laser device according to an aspect of the present disclosure, a thickness of the first semiconductor layer in a region under the current injection region may be same as a thickness of the first semiconductor layer in a region under the second semiconductor layer.

This configuration allows the laser structure to be an inner-stripe structure, so that current can be confined only by the second semiconductor layer. Accordingly, the current injection region in another semiconductor layer stacked on the second semiconductor layer can be sufficiently expanded compared to the current injection region (for example, opening) in the second semiconductor layer, and thus current can be inhibited from being confined in the other semiconductor layer. Furthermore, an increase in a series resistance can be inhibited by current confined in a current injection inhibition region defined by the thin second semiconductor layer. Thus, the semiconductor laser device can be driven at a low voltage, which cannot be achieved by a ridge wide stripe laser.

In the semiconductor laser device according to an aspect of the present disclosure, $0°<\theta\leq0.5°$ may be satisfied, where $\theta$ denotes an angle between the lengthwise direction of the resonator and a straight line which connects a widthwise end of the width varying region on the front end face side and a widthwise end of the width varying region on the rear end face side.

In a wide stripe shape of a super-long resonator having length L of 3 mm or more, the shape of a light intensity distribution in the longitudinal direction of the optical waveguide are determined by the reflectance of the front end face and the reflectance of the rear end face, and the intensity distribution decreases from the front end face towards the rear end face in a shape of an exponential function. Thus, carriers injected into the active layer in the optical waveguide are exponentially consumed according to the light intensity distribution. Light which propagates in the optical waveguide propagates in, as a main optical waveguide region, a region defined by straight lines that connect widthwise ends on the front end face side and widthwise ends on the rear end face side and stretching toward the front end face, in the width varying region of the current injection region defined by the second semiconductor layer. A light intensity distribution in the longitudinal direction of the optical waveguide exponentially decreases from the front end face side to the rear end face side, and thus ideally, carriers are exponentially injected into the active layer from the front end face side to the rear end face side. In the case of a super-long resonator having length L of 3 mm or more, a region near the front end face is wider than the shape of an exponential function, yet as the region is closer to the rear end face side in the longitudinal direction of the optical waveguide, the region is substantially asymptotically similar to a straight shape obtained by connecting widthwise ends on the front end face side and widthwise ends on the rear end face side of the second semiconductor layer. Thus, carries can be injected in a distributing manner, in accordance with the shape according to the light intensity distribution in the longitudinal direction of the active layer in the optical waveguide. Accordingly, injected carriers can be distributed according to the light intensity distribution in the longitudinal direction in the optical waveguide, by merely and simply defining angle $\theta$ (taper angle) as described above.

Since taper angle $\theta$ is caused to satisfy $0°<\theta\leq0.5°$, the spatial hole burning in the longitudinal direction and the spatial hole burning in the transverse direction can be inhibited, and furthermore the utilization efficiency of injected carriers can be improved as much as possible, thus achieving a high-output semiconductor laser device that can be driven at a low voltage, and can operate using low current, owing to low threshold current and high slope efficiency.

In the semiconductor laser device according to an aspect of the present disclosure, the width varying region may have a tapered shape defined by straight lines which connect widthwise ends on the front end face side to widthwise ends on the rear end face side.

According to this configuration, the taper loss of the width varying region of the tapered shape can be controlled by controlling the taper angle, and ultralow loss optical waveguide can be readily designed by controlling taper loss with high precision.

Here, generally, if the optical waveguide has a tapered shape, optical waveguide loss increases since taper loss is added to the optical waveguide loss. The amount of taper loss can be controlled by controlling the taper angle, yet the taper angle is to be controlled with $0.1°$ level precision. When length L of the resonator is long, specifically, 3 mm or more, the precision of controlling the taper angle can be improved by giving a tapered shape defined by straight lines that connect widthwise ends of the width varying region on the front end face side to widthwise ends of the width varying region on the rear end face side. For example, the taper angle can be readily controlled with the precision of $0.01°$. Accordingly, an ultralow loss optical waveguide achieved by highly precise control of taper loss can be readily designed.

In the semiconductor laser device according to an aspect of the present disclosure, the second semiconductor layer may have an opening corresponding to the current injection region.

This achieves an inner stripe type gain guide laser which can cause a current confining structure to independently function above the first semiconductor layer. Accordingly, the effect of confining laser light in the transverse direction is weaken by heat generated according to the value of injected current, a high order of a transverse mode is determined by self alignment due to optical confinement in the transverse direction determined by heat generated according to the shape of the current injection region defined by the second semiconductor layer, and thus higher-order transverse modes which can be present in the optical waveguide can be used without excess and deficiency. As a result, injected carriers can be used efficiently.

In the semiconductor laser device according to an aspect of the present disclosure, the active layer may have a single quantum well structure.

This configuration can decrease the volume of the active layer. Accordingly, since the width varying region has greater width S1 on the front end face side than width S2 on the rear end face side, and thus the light density in the optical waveguide on the front end face side decreases, unevenness of gains due to a decrease in the volume of the active layer can be inhibited. As a result, a threshold current that flows when the semiconductor laser device operates can be decreased, and thus a driving current can be further decreased.

In the semiconductor laser device according to an aspect of the present disclosure, the first conductivity side semiconductor layer may include a first light guiding layer, and the laser light emitted by the semiconductor laser device may have a highest intensity in the first light guiding layer.

Accordingly, the highest light intensity of a light distribution in the optical waveguide in the stacking direction is caused to be in the first light guiding layer in the first conductivity side semiconductor layer, rather than in the active layer, so that the first light guiding layer can be a main light guiding layer. Accordingly, a light distribution in the stacking direction in the optical waveguide can be caused to expand toward the first conductivity side semiconductor layer, and thus the influence exerted by light absorption loss in the active layer and the second conductivity side semiconductor layer can be decreased. As a result, the optical waveguide loss can be significantly decreased, and thus a threshold current can be further decreased.

In the semiconductor laser device according to an aspect of the present disclosure, the second conductivity side semiconductor layer may include a second light guiding layer between the active layer and the first semiconductor layer, the first semiconductor layer may be a second conductivity side cladding layer, and the second semiconductor layer may be a current blocking layer.

By introducing the second light guiding layer as a second conductivity side light guiding layer into a low-loss laser structure in which the first light guiding layer is used as a main optical waveguide layer by causing the highest light intensity of the light distribution in the stacking direction in the optical waveguide to be in the first light guiding layer as described above, an end portion of the light distribution in the stacking direction shifted towards the first light guiding layer can upwardly extend toward the second conductivity side semiconductor layer. Accordingly, another end portion of the light distribution that extends toward the first conductivity side semiconductor layer and absorption loss caused by light being absorbed by an impurity can be finely adjusted, thus achieving ultralow loss and an ultralow threshold.

In the semiconductor laser device according to an aspect of the present disclosure, the second light guiding layer may include an undoped light guiding layer on an active layer side closer to the active layer.

As described above, an end portion of the light distribution in the stacking direction shifted towards the first light guiding layer can upwardly extend toward the second conductivity side semiconductor layer, by introducing the second light guiding layer into a low-loss laser structure in which the first light guiding layer is used as a main optical waveguide layer by causing the highest light intensity of the light distribution in the stacking direction in the optical waveguide to be in the first light guiding layer, yet the second light guiding layer includes a layer doped with an impurity for carrier injection. Accordingly, the optical absorption loss occurs due to impurity doping. On the other hand, as in the present disclosure, the optical absorption loss due to impurity doping can be decreased by providing an undoped light guiding layer in the second light guiding layer. Accordingly, ultralow loss can be achieved by further decreasing the amount of light absorption, and a threshold can be significantly decreased.

In the semiconductor laser device according to an aspect of the present disclosure, the first conductivity side semiconductor layer may include a first conductivity side cladding layer, and the first conductivity side cladding layer and the second conductivity side cladding layer may have a composition represented by $Al_xGa_{1-x}As$, where $0<x<1$.

This configuration achieves a semiconductor laser device which includes an AlGaAs based cladding layer.

In the semiconductor laser device according to an aspect of the present disclosure, at least one of the first conductivity side cladding layer and the second conductivity side cladding layer may include a stacked film which includes two or more layers having different Al ratios, and among the two or more layers in the stacked film, a layer having a lower Al concentration may be more distant from the active layer.

As described above, an end portion of the light distribution in the stacking direction shifted towards the first light guiding layer can upwardly extend toward the second conductivity side semiconductor layer, by introducing the second light guiding layer into a low-loss laser structure in which the first light guiding layer is used as a main optical waveguide layer by causing the highest light intensity of the light distribution in the stacking direction in the optical waveguide to be in the first light guiding layer, yet the first conductivity side cladding layer and the second conductivity side cladding layer have a composition represented by $Al_xGa_{1-x}As$ ($0<x<1$), and at least one of the first conductivity side cladding layer and the second conductivity side cladding layer is a stacked film which includes two or more layers having different Al ratios, so that a light distribution in the stacking direction in the optical waveguide can be freely and finely adjusted, and thus loss can be further significantly reduced. Moreover, among two or more layers in a stacked film, a layer having a lower Al concentration is more distant from the active layer, band gap energy of a layer having little influence on the light distribution in the stacking direction can be decreased. Accordingly, a series resistance while the semiconductor laser device is operating can be decreased as small as possible, and thus temperature characteristics are improved and operation can be performed with low power consumption.

In the semiconductor laser device according to an aspect of the present disclosure, the first light guiding layer may have a composition represented by $Al_xGa_{1-x}As$, where $0<x<1$.

This configuration can achieve the semiconductor laser device which includes the AlGaAs based first light guiding layer.

In this case, in the semiconductor laser device according to an aspect of the present disclosure, the first light guiding layer may include a stacked film which includes two or more layers having different Al ratios, and among the two or more layers in the stacked film, a layer having a lower Al concentration may be closer to the active layer.

As described above, the highest light intensity of the light distribution in the stacking direction in the optical waveguide is caused to be in the first light guiding layer, whereby the shape of the light distribution in the first light guiding layer in which most of the light distribution is present can be directly adjusted. Furthermore, since the first light guiding layer is a stacked film which includes two or more layers having different Al ratios, the shape of the light distribution can be directly adjusted with high precision, thus further significantly reducing loss and further decreasing the threshold. Accordingly, the device can be driven using further low current. Moreover, among two or more layers in a stacked film, a layer having a lower Al concentration is on a side more distant from the active layer, band gap energy of a layer having little influence on the light distribution in the stacking direction can be decreased. Accordingly, a series resistance while the semiconductor laser device is operating can be further decreased, and thus temperature characteristics can be improved and operation can be performed with low power consumption.

In one aspect of the semiconductor laser device according to the present disclosure, the active layer may have a composition represented by $Al_xIn_yGa_{1-x-y}As$ ($0 \le x<1$, $0 \le y<1$).

This configuration achieves a semiconductor laser device which includes an AlInGaAs based active layer.

In the semiconductor laser device according to an aspect of the present disclosure, the first conductivity side cladding layer, the second conductivity side cladding layer, and the active layer may each have a composition represented by $Al_xGa_{1-x-y}In_yN$, where $0 \leq x \leq 1$ and $0 \leq y \leq 1$.

This configuration can achieve a semiconductor laser device which includes an AlGaInN based cladding layer and an AlGaInN based active layer.

The semiconductor laser device according to an aspect of the present disclosure may further include: a plurality of stacked structures each of which is the stacked structure, and the plurality of stacked structures may be stacked with one or more tunnel junctions therebetween.

Accordingly, high-output laser structures which can be driven at a low voltage are stacked, and thus a plurality of emitters can be simultaneously caused to perform laser oscillation operation using injected current having an amount for one emitter. Accordingly, a semiconductor laser device which can increase slope efficiency, and cause the stacked emitters to simultaneously emit light can be achieved, and ultra high-output laser light can be taken out with low current consumption.

In the semiconductor laser device according to an aspect of the present disclosure, the width of the width varying region on the front end face side may be a width of the current injection region on the front end face side, and the width of the width varying region on the rear end face side may be a width of the current injection region on the rear end face side.

Accordingly, the entire current injection region can be achieved by a width varying region.

In the semiconductor laser device according to an aspect of the present disclosure, the current injection region may further include a constant width region in which a width is constant.

This achieves a semiconductor laser device which includes the current injection region which includes the width varying region and the constant width region.

In this case, in the semiconductor laser device according to an aspect of the present disclosure, the constant width region may be closer to the front end face than the width varying region is.

Accordingly, this achieves a semiconductor laser device which includes a current injection region in which the width varying region is formed on the front end face side, and the constant width region is formed on the rear end face side.

A semiconductor laser module according to an aspect of the present disclosure includes the semiconductor laser device according to one of the above aspects.

Accordingly, this achieves a high-output semiconductor laser module which includes a semiconductor laser device that can be driven at a low voltage.

A laser light source system for welding according to an aspect of the present disclosure includes the semiconductor laser device according to one of the above aspects.

Accordingly, this achieves a laser light source system for welding which includes the high-output semiconductor laser device which can be driven at a low voltage.

A high-output semiconductor laser device that can be driven at a low voltage while inhibiting the occurrence of COD, a semiconductor laser module, and a laser light source system for welding, for instance, can be achieved.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Circumstances Which Have Led to an Aspect of the Present Disclosure

Although there has been a demand for a higher-output semiconductor laser device driven at a low voltage, a semiconductor laser device which makes high output of 10 W or more per emitter has a very high making current (injected current). For example, in the case of a multi-emitter laser having a making current higher than 10 A per emitter, the total making current is 10 A×N emitters, so that the total making current will even reach 200 A if N=20. It is effective to improve efficiency of power conversion in order to achieve a high-output semiconductor laser device driven at a low voltage, yet it is important to accumulate improvement in electrical and optical characteristics of the emitters to achieve high efficiency of power conversion. Especially, a decrease in rise voltage (threshold voltage), a decrease in internal resistance, a decrease in a threshold and improvement in slope efficiency achieved by improving the utilization efficiency of injected carriers, and a rise in a heat saturation level are characteristics that are to be particularly taken into consideration.

Figure 22A:
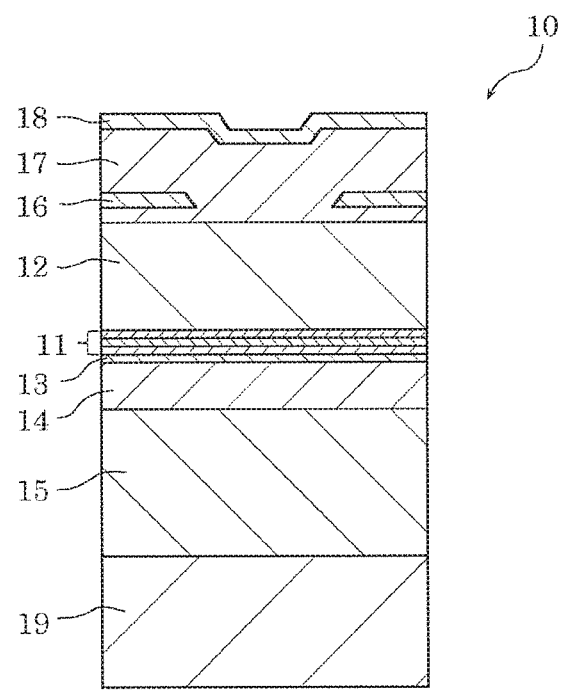
FIG. 22A is a cross-sectional view of a conventional semiconductor laser device.
Figure 22B:
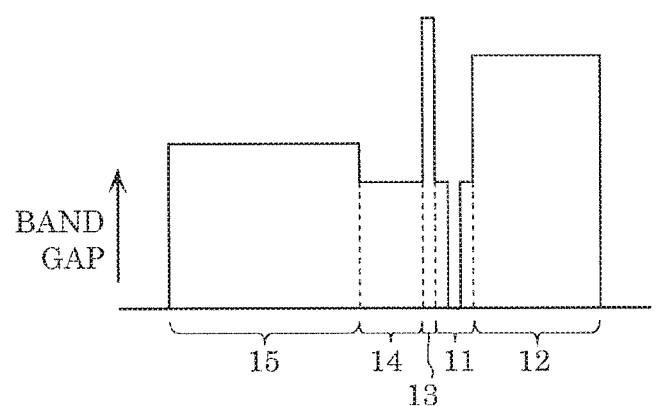
FIG. 22B is a distribution map of band gaps of layers of the conventional semiconductor laser device.

According to conventional semiconductor laser device 10 illustrate FIG. 22A, it is possible to reduce overflow of holes by a barrier layer having a high band gap in a high-output semiconductor laser device, yet carriers injected into the active layer cause electrons in a conduction band to be subjected to high energy barrier of barrier layer 13, so that driving the semiconductor laser device requires a high turn-on voltage. Accordingly, a driving voltage is increased due to a high rise voltage and a series resistance, thus generating a large amount of heat.

While such a configuration is adopted, if the state is brought into a highly carrier injected state by increasing a making current per emitter up to 10 A or higher with intention of making still higher output, carriers close to the active layer which are accelerated by a high rise voltage will act as follows. Specifically, holes having a large effective mass are blocked by barrier layer 13 formed in a valence band and having a high Al ratio (Al percentage: 60%), and are efficiently injected into the valence band of the active layer. However, electrons having a small effective mass are accelerated by a high rise voltage and pass through the conduction band of the active layer, the percentage of overflow of electrons which move toward upper cladding layer 12 increases, and the electrons are consumed as wattless current so as to eventually generate heat, thus causing the entire device to generate heat. Accordingly, temperature characteristics greatly deteriorate with increasing speed, due to negative feedback that the current dependency of light output loses linearity, a heat saturation level falls, overflow of electrons further accelerates, wattless current increases, and heat is generated. In a semiconductor laser device brought into such a driving state, the junction temperature in an active layer portion increases with an increase in wattless current, so that a slow deterioration speed accelerates. A relation of the dependency of a slow deterioration time on a junction temperature is inversely proportional since the slow deterioration time decreases with an increase in the junction temperature, which is known. Accordingly, it is obviously difficult to achieve long term reliability in a state where the junction temperature is high.

Even when a chip area is remarkably large relative to a current injection region, heat generated in the current injection region diffuses over the entire chip and dissipates, yet the junction temperature of the active layer maintains high so as to be continuously under heavy load. Thus, the current dependency of light output slightly improves, but loses linearity, and a laser device is driven in a heat saturated state (that is, a state in which there is a large amount of wattless current). Hence, it is still difficult to achieve long term reliability as a result.

As described above, it is difficult to achieve long term reliability of super high-output semiconductor laser device that uses a high injected current if any of a decrease in rise voltage (threshold voltage), a decrease in internal resistance, a decrease in a threshold and improvement in slope efficiency which are achieved by improving utilization efficiency of injected carriers, and a rise in the heat saturation level is failed to be achieved.

In order to achieve a high-output semiconductor laser device, high-output light is taken out though the front end face from which emitted laser light exits, yet in this case, the occurrence of COD due to the emitted light melting and damaging the front end face and the vicinity thereof is to be inhibited.

In order to inhibit the occurrence of COD, light density at the front end face may be lowered. In this case, for example, it is effective to coat the front end face with a dielectric film which achieves low reflectance, specifically, light reflectance of 10% or less, and coat a rear end face with a dielectric film which achieves high reflectance, specifically, light reflectance of about 95%. This configuration improves efficiency of taking out laser light through the front end face, improves slope efficiency in current-light output characteristics (I-L characteristics), and decreases the value of operating current, thus reducing the amount of heat generated in the semiconductor laser device. Further, the light density on the front end face can be decreased by coating the front end face with a dielectric film which provides low reflectance, and thus the value of light output which may lead to the occurrence of COD can be greatly increased. Thus, the occurrence of COD can be inhibited. However, it is difficult to achieve a high-output semiconductor laser device which can be driven using a low voltage, while inhibiting the occurrence of COD.

Figure 23A:
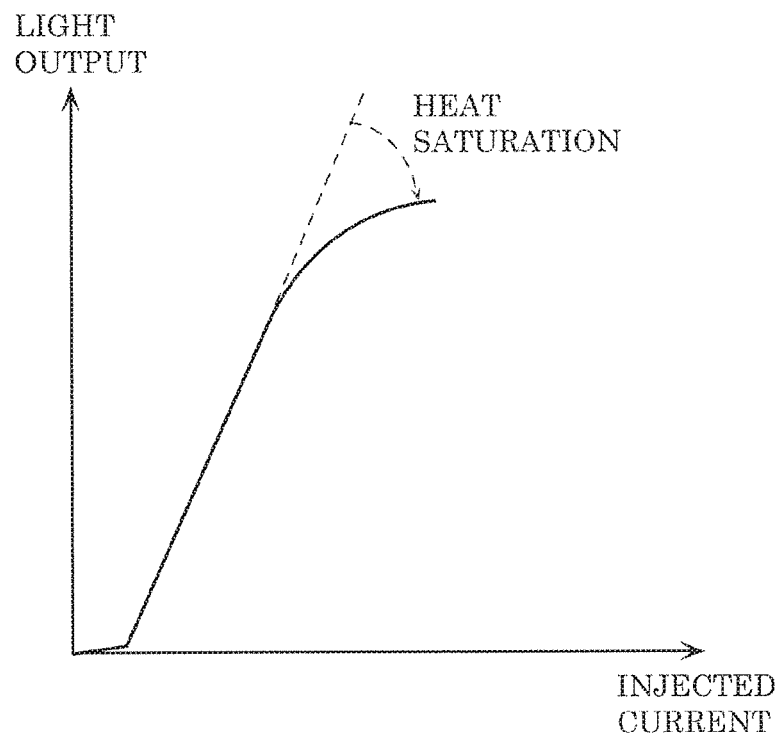
FIG. 23A illustrates a state in which heat saturation is caused by high output in a typical semiconductor laser device.
Figure 23B:
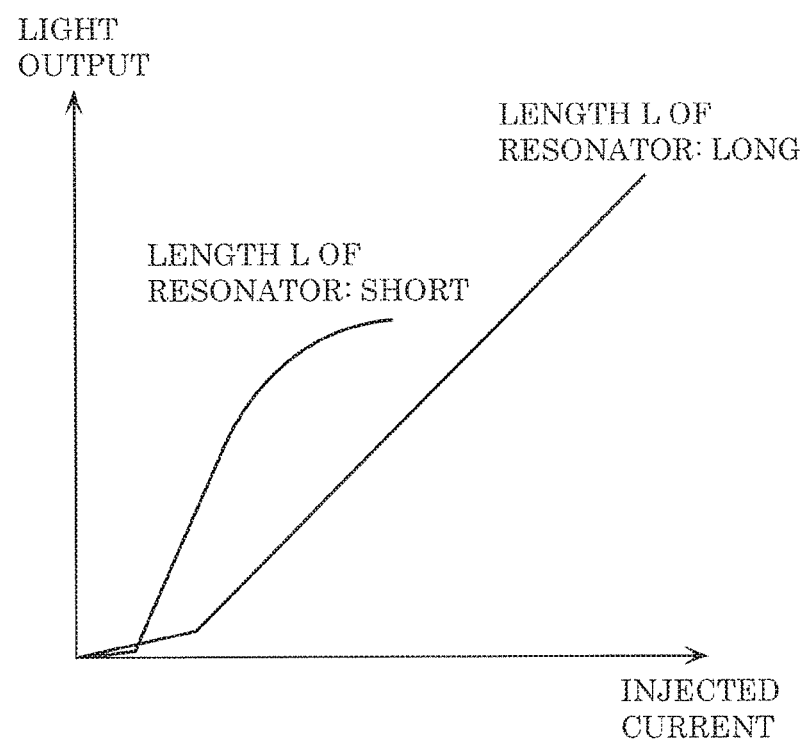
FIG. 23B illustrates current-light output characteristics with respect to a change in length L of a resonator in the typical semiconductor laser device.

A window-mirror structure is widely used for a semiconductor laser device made of an AlGaAs based material, in order to secure reliability which guarantees long-time stable operation of a high-output semiconductor laser device for which high light output of at least hundreds of mW is normally required. With the window-mirror structure, band gap energy is increased by diffusing an impurity in the active layer of a quantum well structure near the front end face and the rear end face, and those portions are made transparent to light which propagates in an optical waveguide. Accordingly, this prevents heat generated due to optical absorption near the front end face and the rear end face from reducing a decrease in band gap energy. Furthermore, a wide stripe laser structure in which a stripe is widened to have a width in a range from about 50 μm to 100 μm, so that light density on the front end face is reduced by greatly expanding a light distribution in the transverse direction of the optical waveguide, and high-output light can be taken out while inhibiting occurrence of COD. In this case, generally, in order to take out high-output light, length L of a resonator is increased as shown in FIG. 23B so as not to allow laser oscillation operation to cause heat saturation due to high output as illustrated in FIG. 23A, mirror loss is reduced while making sacrifices, namely an increase in threshold current and a decrease in slope efficiency, and laser oscillation operation is performed with a lowered operation carrier density.

However, the result of examination made by the inventors of the present application has revealed that even a semiconductor laser device which has the laser structure to which the above technique is applied has more problems, if high output of 10 W or greater per emitter is to be achieved.

Figure 24A:
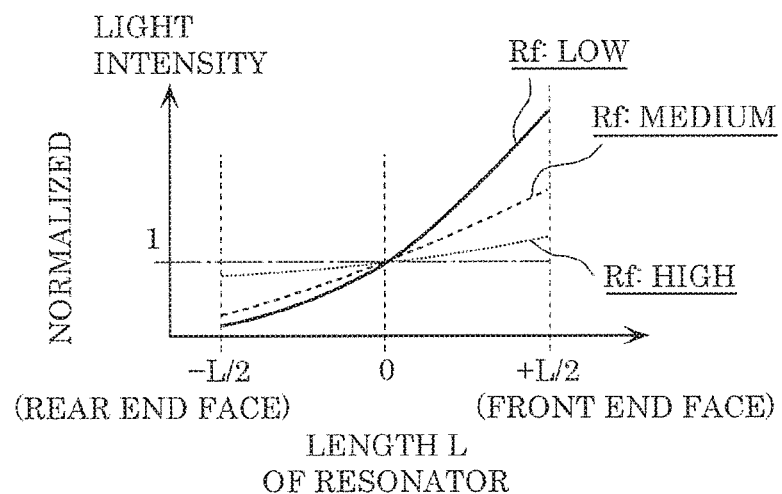
FIG. 24A is a schematic diagram illustrating dependency of light intensity on a reflectance of the front end face, in the longitudinal direction of the optical waveguide.
Figure 24B:
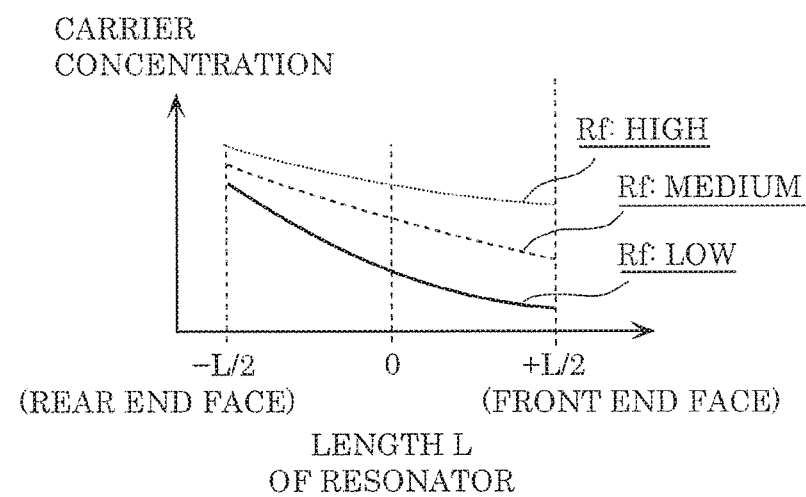
FIG. 24B is a schematic diagram illustrating dependency of a carrier concentration on a reflectance of the front end face, in the longitudinal direction of the optical waveguide.

Specifically, it has been found that in the case of a semiconductor laser device having a straight stripe structure in which a current stripe width is constant in the lengthwise direction of the resonator, the lower the reflectance of the front end face becomes, the greater a difference in intensity of light distribution in the longitudinal direction of the optical waveguide becomes. This will be described with reference to FIGS. 24A and 24B. FIG. 24A is a schematic diagram illustrating dependency of light intensity on reflectance of a front end face in the longitudinal direction of the optical waveguide, and FIG. 24B is a schematic diagram illustrating dependency of carrier density on reflectance of a front end face in the longitudinal direction of the optical waveguide.

As illustrated in FIG. 24A, if reflectance of the front end face decreases, a light distribution in the optical waveguide shows that light intensity on the front end face side is significantly higher than that on the rear end face side, and light intensity is distributed in a shape that is unbalanced relative to the longitudinal direction of the optical waveguide (the lengthwise direction of the resonator). Accordingly, also carriers evenly injected into an active layer region in the optical waveguide in the longitudinal direction are consumed by stimulated emission, more on the front end face side and less on the rear end face side, and thus carriers are consumed unevenly also in the longitudinal direction. As a result, as illustrated in FIG. 24B, the carrier density is also distributed in a shape that is unbalanced relative to the longitudinal direction of the optical waveguide.

Here, in current injection, how easy current flows changes due to a series resistance of the current injection region in the stacking direction, but nevertheless, a making current is evenly injected into the current injection region if the semiconductor laser device has a straight stripe structure.

Accordingly, such uneven carrier consumption in the longitudinal direction of the optical waveguide imbalances carriers, and causes spatial hole burning in the lengthwise direction (the longitudinal direction of the optical waveguide). As a result, the gain in the lengthwise direction of the resonator becomes uneven, so that high-output light cannot be taken out.

Figure 25A:
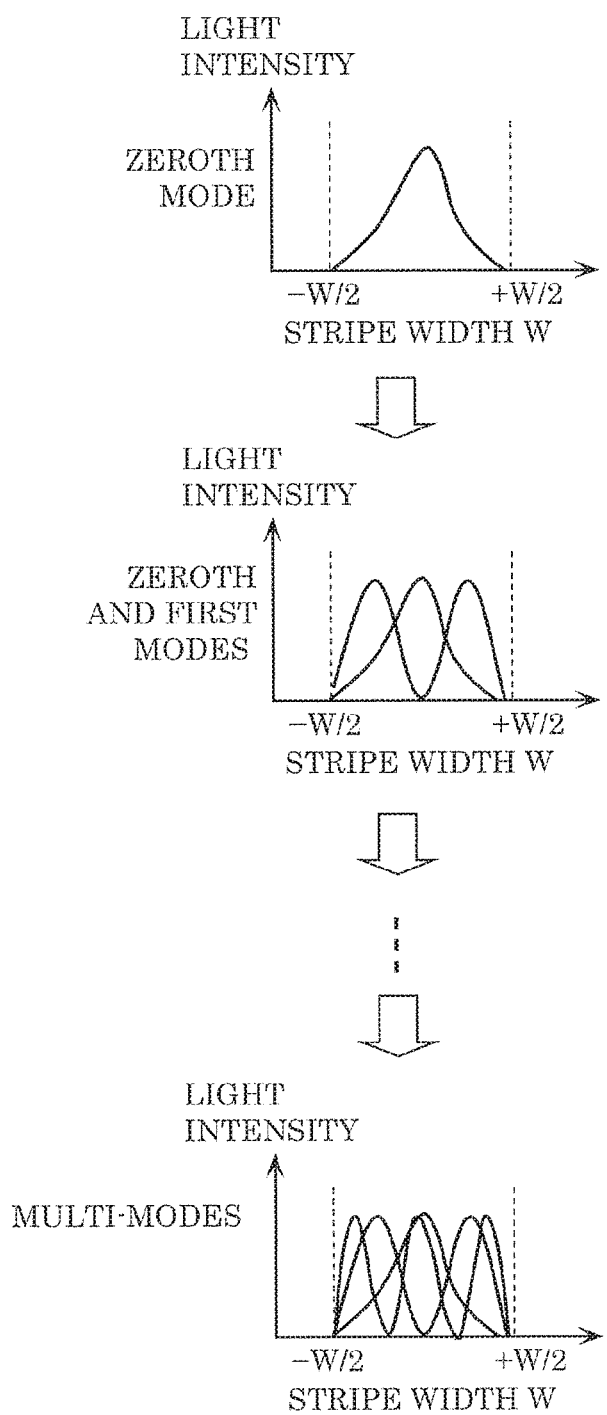
FIG. 25A is a schematic diagram illustrating dependency of a distribution shape of the light intensity on the number of optical transverse modes, in the horizontal direction of the optical waveguide.
Figure 25B:
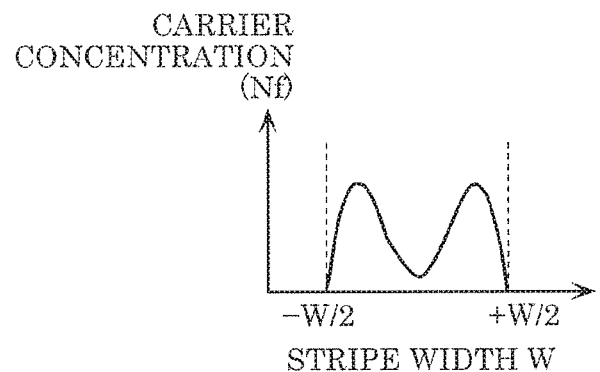
FIG. 25B is a schematic diagram illustrating dependency of a distribution shape of a carrier concentration on the number of optical transverse modes, in the horizontal direction of the optical waveguide.
Figure 25B:
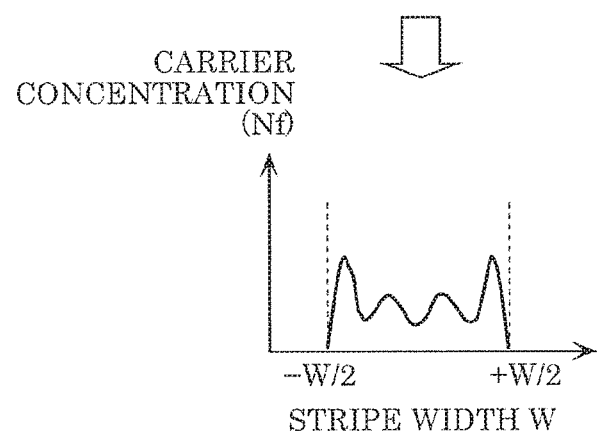
Figure 25B:
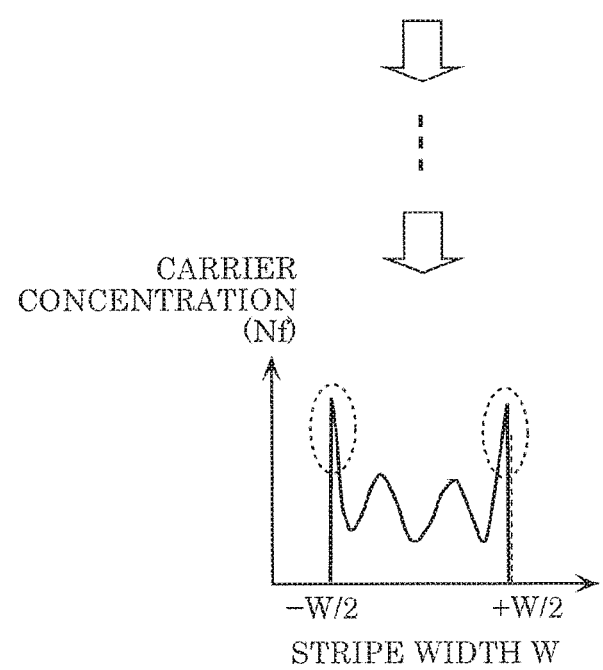

The semiconductor laser device having a straight stripe structure has a new problem in the transverse direction of the optical waveguide. This point will be described with reference to FIGS. 25A and 25B. FIG. 25A is a schematic diagram illustrating dependency of a distribution shape of light intensity on the number of optical transverse modes, in the horizontal direction of the optical waveguide, and FIG. 25B is a schematic diagram illustrating dependency of a distribution shape of carrier density on the number of optical transverse modes, in the horizontal direction of the optical waveguide.

As illustrated in FIG. 25A, as the order of an optical transverse mode (horizontal optical transverse mode) increases from the 0th-order mode, light distribution in the optical waveguide in the transverse direction has a shape in which more protrusions overlap. Specifically, the overlapping degree is increased as light has multi-modes. As illustrated in FIG. 25B, as the order of an optical transverse mode increases from the 0th-order mode, a recess in the center portion in the optical waveguide in a distribution of concentration of carriers injected into the active layer in the optical waveguide decreases and is flattened along with a change in a light distribution within the optical waveguide in FIG. 25A, so that unevenness is eliminated. Furthermore, if light has multi-transverse modes, carrier consumption in the center portion is made even, yet light distribution is low at the end portions of the optical waveguide in the transverse direction, and thus there are many carriers which are not consumed, and as a result, sharp protruding shapes are present at the end portions of the optical waveguide in the transverse direction. Specifically, even if light inside of the optical waveguide has multi-transverse modes, light distribution in the transverse direction becomes uneven, and spatial hole burning in the transverse direction (width direction of the optical waveguide) occurs. Accordingly, due to a change in the refractive index by the spatial hole burning in the transverse direction in addition to a decrease in the utilization efficiency of injected carriers, symmetry of emission beams deteriorates, and light intensity distribution becomes partially uneven.

Accordingly, in a high-output semiconductor laser device having a straight stripe structure, a difference in the reflectance between the front end face and the rear end face is increased by excessively lowering reflectance of the front end face in order to achieve higher output and increase slope efficiency, so that unevenness of carriers inside of the optical waveguide increases, and the light intensity becomes uneven. As a result, decrease in light output and slope efficiency is caused on the contrary, which makes it difficult to achieve a high-output semiconductor laser device which exhibits good symmetry of emission beams, high quality, high reliability, and high efficiency of power conversion.

Further, a semiconductor laser device which makes tens of watts of super-high output per emitter has a significantly large operating current value and exhibits significantly great self-heating during operation. In order to reduce heat generated by the semiconductor laser device, it is necessary to reduce power consumption as much as possible, by decreasing operating current and operating voltage.

Figure 26:
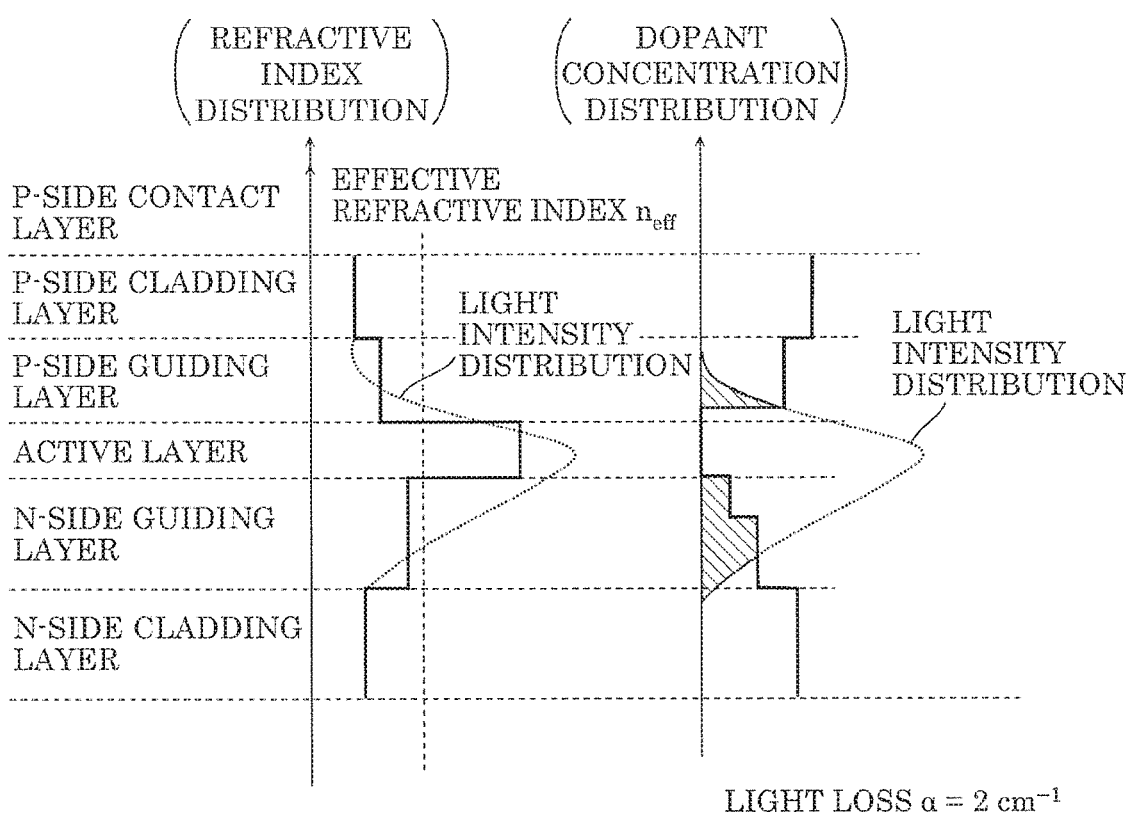
FIG. 26 is a schematic diagram illustrating profiles of a light distribution and a dopant concentration distribution in a structure of confining light in the longitudinal direction in a typical edge-emitting semiconductor laser device.

FIG. 26 illustrates profiles of light distribution and dopant concentration distribution in a lengthwise light confinement structure in a typical edge-emitting semiconductor laser device. Light loss $\alpha$ in such a structure has a value of about 2 cm$^{-1}$. Note that light loss $\alpha$ is represented by light loss $\alpha$=mirror loss $\alpha_m$+optical waveguide loss $\alpha_1$+free carrier loss $\alpha_{free}$.

However, as described above, a semiconductor laser device which makes tens of watts of super-high output has a significantly large operating current value, and thus the semiconductor laser device generates significantly great amount of heat due to an excessive amount of light loss.

The present disclosure has been conceived based on the above findings, and is to provide, by paying attention to a light intensity distribution and a distribution of concentration of carriers injected into the active layer, inside of an optical waveguide in the longitudinal direction, a semiconductor laser device which makes tens of watts of high output at high efficiency of power conversion and can be driven at a low voltage, while inhibiting the occurrence of COD.

Furthermore, the present disclosure is to achieve a semiconductor laser device which can be driven at a lower voltage and make higher output by increasing utilization efficiency of injected carriers while inhibiting spatial hole burning, and also can operate using a low current, owing to a low threshold current and high slope efficiency.

The following describes embodiments of the present disclosure. Note that the embodiments described below each show a particular example of the present disclosure. Therefore, the numerical values, shapes, materials, elements, and the arrangement and connection of the elements, for instance, described in the following embodiments are examples, and thus are not intended to limit the present disclosure. Accordingly, among the elements in the following embodiments, elements not recited in any of the independent claims defining the most generic concept of the present disclosure are described as arbitrary elements.

The drawings are schematic diagrams, and do not necessarily provide strictly accurate illustration. Accordingly, scaling is not necessarily consistent throughout the drawings. In the drawings, the same numeral is given to substantially the same configuration, and a redundant description thereof may be omitted or simplified.

Embodiment 1

Figure 1:
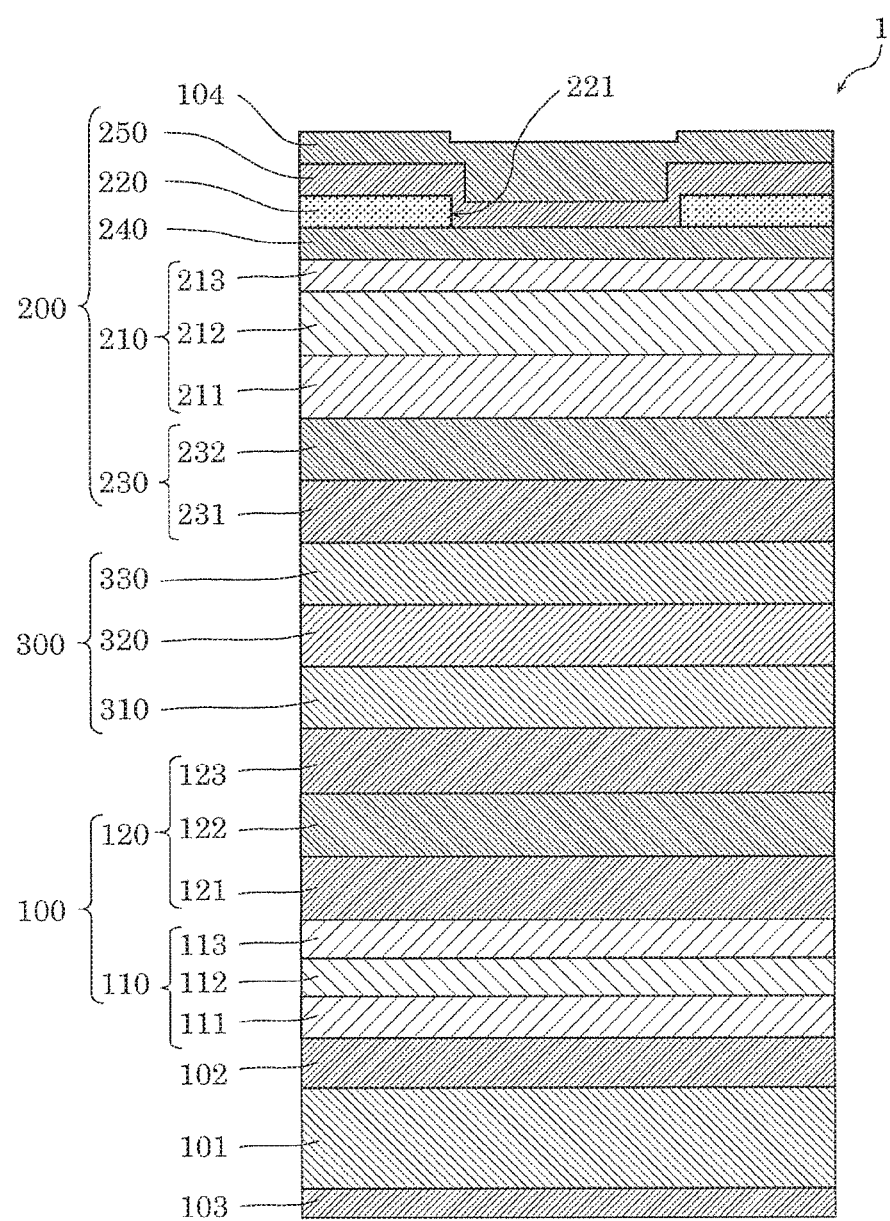
FIG. 1 is a cross-sectional view of a semiconductor laser device according to Embodiment 1.

First, a configuration of semiconductor laser device 1 according to Embodiment 1 is described with reference to FIG. 1. FIG. 1 is a cross-sectional view of semiconductor laser device 1 according to Embodiment 1.

As illustrated in FIG. 1, semiconductor laser device 1 according to Embodiment 1 is an edge-emitting laser device which includes a stacked structure in which first conductivity side semiconductor layer 100, active layer 300, and second conductivity side semiconductor layer 200 are stacked in the stated order, and emits laser light through multi-transverse mode oscillation.

Specifically, semiconductor laser device 1 includes substrate 101, buffer layer 102 formed on the upper surface of substrate 101, first conductivity side semiconductor layer 100 formed on buffer layer 102, active layer 300 formed on first conductivity side semiconductor layer 100, second conductivity side semiconductor layer 200 formed on active layer 300, first electrode 103 formed on the undersurface of substrate 101, and second electrode 104 formed on second conductivity side semiconductor layer 200. Note that the first conductivity type is an n-type in the present embodiment. The second conductivity type is a conductivity type different from the first conductivity type, and is a p-type.

In the present embodiment, substrate 101 is an n-GaAs substrate. Buffer layer 102 is an n-GaAs layer having a thickness of 0.5 µm, for example, and is stacked on substrate 101.

First conductivity side semiconductor layer 100 is an n-side semiconductor layer, for example, and includes a plurality of semiconductor layers. Specifically, first conductivity side semiconductor layer 100 includes n-side first semiconductor layer 110, and n-side second semiconductor layer 120.

N-side first semiconductor layer 110 is formed on buffer layer 102. In the present embodiment, n-side first semiconductor layer 110 is an n-side cladding layer (first conductivity side cladding layer) having a total thickness of 3.395 µm, and has a composition represented by $Al_xGa_{1-x}As$ (0<x<1).

N-side first semiconductors layer 110 includes a stacked film which includes at least two layers having different Al ratios. Specifically, n-side first semiconductor layer 110 is a stacked film in which n-type first cladding layer 111 made of n-$Al_{0.15}Ga_{0.85}As$ (and has a thickness of 0.05 µm), n-type second cladding layer 112 made of n-$Al_{0.335}Ga_{0.665}As$ (and has a thickness of 2.85 µm), and n-type third cladding layer 113 made of n-$Al_{0.335}Ga_{0.665}As$ (and has a thickness of 0.465 µm) are stacked in the stated order. In the stacked film of n-side first semiconductor layer 110, a layer having a lower Al concentration is on a side more distant from active layer 300.

N-side second semiconductor layer 120 is formed on n-side first semiconductor layer 110. N-side second semiconductor layer 120 is formed between n-side first semiconductor layer 110 and active layer 300. In the present embodiment, n-side second semiconductor layer 120 is a first light guiding layer (having a total thickness of 0.605 µm) which is an n-side light guiding layer, and has a composition represented by $Al_xGa_{1-x}As$ (0<x<1).

N-side second semiconductor layer 120 (first light guiding layer) includes a stacked film which includes at least two layers having different Al ratios. Specifically, n-side second semiconductor layer 120 is a stacked film in which n-type first optical waveguide layer 121 (having a thickness of 0.56 µm) made of n-$Al_{0.27}Ga_{0.73}As$, n-type second optical waveguide layer 122 (having a thickness of 0.040 µm) made of n-$Al_{0.27}Ga_{0.73}As$, and n-type third optical waveguide layer 123 (having a thickness of 0.005 µm) made of n-$Al_{0.25}Ga_{0.75}As$ are stacked in the stated order. In the stacked film of n-side second semiconductor layer 120, a layer having a lower Al concentration is on a side closer to active layer 300.

Second conductivity side semiconductor layer 200 on active layer 300 is, for example, a p-side semiconductor layer, and includes a plurality of semiconductor layers. Specifically, second conductivity side semiconductor layer 200 includes p-side first semiconductor layer 210 and p-side second semiconductor layer 220 in the order from the side closer to active layer 300. More specifically, second conductivity side semiconductor layer 200 includes p-side first semiconductor layer 210, p-side second semiconductor layer 220, p-side third semiconductor layer 230, p-side fourth semiconductor layer 240, and p-side fifth semiconductor layer 250.

P-side first semiconductor layer 210 is formed on p-side third semiconductor layer 230. P-side first semiconductor layer 210 is formed between p-side third semiconductor layer 230 and p-side fourth semiconductor layer 240. In the present embodiment, p-side first semiconductor layer 210 is a p-side cladding layer (second conductivity side cladding layer) having a total thickness of 0.75 µm, and has a composition represented by $Al_xGa_{1-x}As$ (0<x<1).

P-side first semiconductor layer 210 includes a stacked film which includes at least two layers having different Al ratios. Specifically, p-side first semiconductor layer 210 is a stacked film in which p-type first cladding layer 211 (having a thickness of 0.05 µm) made of $p\text{-}Al_{0.35}Ga_{0.35}As$, p-type second cladding layer 212 (having a thickness of 0.65 µm) made of $p\text{-}Al_{0.65}Ga_{0.35}As$, and p-type third cladding layer 213 (having a thickness of 0.05 µm) made of $p\text{-}Al_{0.15}Ga_{0.85}As$ are stacked in the stated order. In the stacked film of p-side first semiconductor layer 210, a layer having a lower Al concentration is disposed on a side more distant from active layer 300.

P-side second semiconductor layer 220 is formed on p-side fourth semiconductor layer 240. P-side second semiconductor layer 220 is formed between p-side fourth semiconductor layer 240 and p-side fifth semiconductor layer 250. In the present embodiment, p-side second semiconductor layer 220 is an n-type current blocking layer (a second conductivity side current blocking layer) made of n-GaAs and having a thickness of 0.45 µm. Second semiconductor layer 220 has opening 221 corresponding to a current injection region. Opening 221 of second semiconductor layer 220 has a stripe shape which extends in the lengthwise direction of the resonator (longitudinal direction of the resonator) of semiconductor laser device 1, for example.

P-side third semiconductor layer 230 is formed on active layer 300. P-side third semiconductor layer 230 (second light guiding layer) is formed between active layer 300 and p-side first semiconductor layer 210. In the present embodiment, p-side third semiconductor layer 230 is a second light guiding layer which is a p-side light guiding layer, and has a composition represented by $Al_xGa_{1-x}As$ (0<x<1).

P-side third semiconductor layer 230 (second light guiding layer) includes a stacked film which includes at least two layers having different Al ratios. Specifically, p-side third semiconductor layer 230 is a stacked film in which first optical waveguide layer 231 (having a thickness of 0.03 µm) made of $un\text{-}Al_{0.3}Ga_{0.7}As$, and second p-type optical waveguide layer 232 (having a thickness of 0.131 µm) made of $p\text{-}Al_{0.4}Ga_{0.6}As$ are stacked in the stated order. In the stacked film in p-side third semiconductor layer 230, a layer having a lower Al concentration is on a side closer to active layer 300.

In p-side third semiconductor layer 230, first optical waveguide layer 231 is an undoped light guiding layer which is intentionally not doped with an impurity. As mentioned here, p-side third semiconductor layer 230 (second light guiding layer) includes an undoped light guiding layer (first optical waveguide layer 231) on a side closer to active layer 300.

P-side fourth semiconductor layer 240 is formed on p-side first semiconductor layer 210. In the present embodiment, p-side fourth semiconductor layer 240 is a first p-type contact layer (having a thickness of 0.4 µm) made of p-GaAs.

P-side fifth semiconductor layer 250 is formed on p-side second semiconductor layer 220 and p-side fourth semiconductor layer 240, filling opening 221 in p-side second semiconductor layer 220. In the present embodiment, p-side fifth semiconductor layer 250 is a second p-type contact layer (having a thickness of 1.75 µm) made of p-GaAs.

Active layer 300 is formed on first conductivity side semiconductor layer 100. Specifically, active layer 300 is formed between first conductivity side semiconductor layer 100 and second conductivity side semiconductor layer 200. In the present embodiment, active layer 300 has a single quantum well structure. The composition of active layer 300 is $Al_xIn_yGa_{1-x-y}As$ (0≤x<1, 0≤y<1). In the present embodiment, the composition of active layer 300 is $In_xGa_{1-x}As$ (0≤x≤1). In this case, the luminous wavelength ranges from 830 nm to 1000 nm when 0<x<1, and ranges from 780 nm to 860 nm when x=0 (GaAs).

Specifically, active layer 300 is a stacked film in which first barrier layer 310 (having a thickness of 0.005 µm) made of $un\text{-}Al_{0.25}Ga_{0.75}As$, well layer 320 (having a thickness of 0.008 µm) made of $un\text{-}In_{0.17}Ga_{0.83}As$, second barrier layer 330 (having a thickness of 0.01 µm) made of $un\text{-}Al_{0.25}Ga_{0.75}As$ are stacked in the stated order. First barrier layer 310, well layer 320, and second barrier layer 330 are undoped layers which are intentionally not doped with an impurity.

First electrode 103 is an n-side electrode, and second electrode 104 is a p-side electrode. A current is supplied to a stacked structure via first electrode 103 and second electrode 104.

Figure 2:
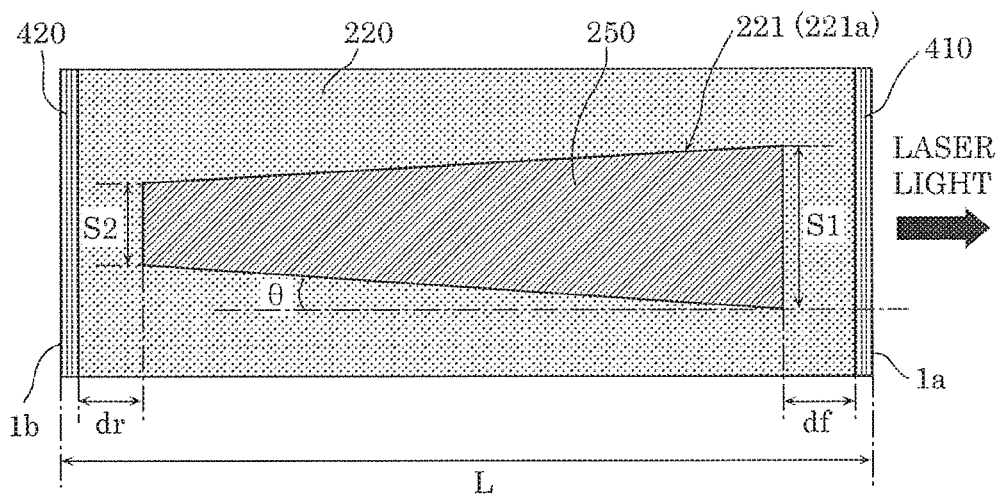
FIG. 2 is a cross-sectional view of the semiconductor laser device according to Embodiment 1 horizontally taken along a p-side second semiconductor layer (current blocking layer)

Here, the structure of semiconductor laser device 1 in the lengthwise direction of the resonator and the shape of opening 221 in p-side second semiconductor layer 220 (current blocking layer) are to be described with reference to FIG. 2. FIG. 2 is a cross-sectional view of semiconductor laser device 1 according to Embodiment 1 horizontally taken along p-side second semiconductor layer 220 (current blocking layer).

The stacked structure included in semiconductor laser device 1 includes front end face 1a from which emitted laser light exits, and rear end face 1b opposite front end face 1a, as illustrated in FIG. 2.

The stacked structure included in semiconductor laser device 1 includes an optical waveguide for which front end face 1a and rear end face 1b are used as reflecting mirrors of the resonator. The width of a current injection region for injecting current into the optical waveguide is defined by second semiconductor layer 220 (current blocking layer). Specifically, the current injection region corresponds to opening 221 of second semiconductor layer 220, and in the present embodiment, the width of the current injection region is defined by the width of opening 221 of second semiconductor layer 220.

Opening 221 of second semiconductor layer 220 (current blocking layer) has opening width varying region 221a in which the width of the opening varies. Specifically, the current injection region corresponding to opening 221 of second semiconductor layer 220 has a width varying region in which the width varies. In the present embodiment, opening 221 of second semiconductor layer 220 (current blocking layer) has a varying width throughout the region, and opening 221 of second semiconductor layer 220 is an opening width varying region. Specifically, the entire current injection region is a width varying region in the stacked structure.

Opening 221 of second semiconductor layer 220 (current blocking layer) is formed on an inner side relative to front end face 1a and rear end face 1b which are end faces of the resonator. Specifically, the end portions of the current injection region in the lengthwise direction of the resonator (longitudinal direction of the optical waveguide) are located on an inner side relative to front end face 1a and rear end face 1b.

In the present embodiment, one of the end portions of opening 221 of second semiconductor layer 220 (current blocking layer) in the longitudinal direction is formed in a position inwardly shifted from front end face 1a by length df. Further, the other end portion of opening 221 of second semiconductor layer 220 (current blocking layer) in the longitudinal direction is formed in a position inwardly shifted from rear end face 1b by length dr. As an example, when length L of the resonator of semiconductor laser device 1 is L=6 mm, lengths df and dr which are amounts of shift are 50 μm. Note that lengths dr and df correspond to the regions in which window-mirror structures are formed, as will be describes below.

S1>S2, where in the current injection region, S1 denotes the width of the width varying region on the front end face side, and S2 denotes the width of the width varying region on the rear end face side. In the present embodiment, the entire current injection region is the width varying region, and thus width S1 of the width varying region on the front end face 1a side is the width of the current injection region on the front end face 1a side, and the width of the width varying region on the rear end face 1b side is the width of the current injection region on the rear end face 1b side.

In the present embodiment, the width of the current injection region corresponds to the width of opening 221 of second semiconductor layer 220, and thus S1>S2, where S1 denotes the width (opening width) of opening 221 of second semiconductor layer 220 (current blocking layer) at the end portion on the front end face 1a side, and S2 denotes the width (opening width) of opening 221 of second semiconductor layer 220 (current blocking layer) at the end portion on the rear end face 1b side.

The shape of opening 221 of second semiconductor layer 220 (current blocking layer) is a tapered shape defined by straight lines which connect widthwise ends on the front end face 1a side to widthwise ends on the rear end face 1b side, and opening width S1 on the front end face 1a side is broader than opening width S2 on the rear end face 1b side. When θ denotes an angle formed between the lengthwise direction of the resonator and a straight line which connects an end of the opening width on the front end face 1a side and an end of the opening width on the rear end face 1b side in opening 221 of second semiconductor layer 220, angle θ represents the taper angle of opening 221 of second semiconductor layer 220.

As illustrated in FIG. 2, first reflection film 410 which includes a dielectric multilayer film is formed on front end face 1a, and second reflection film 420 which includes a dielectric multilayer film is formed on rear end face 1b. First reflection film 410 is a multilayer film which includes $Al_2O_3$ and $Ta_2O_5$ layers from the end face of a crystal, for example. Second reflection film 420 is a multilayer film which includes $Al_2O_3$, $SiO_2$, and $Ta_2O_5$ layers from the end face of a crystal, for example. If R1 denotes the reflectance of first reflection film 410 and R2 denotes the reflectance of second reflection film 420, R1=2% and R2=95%, for example.

Figure 3:
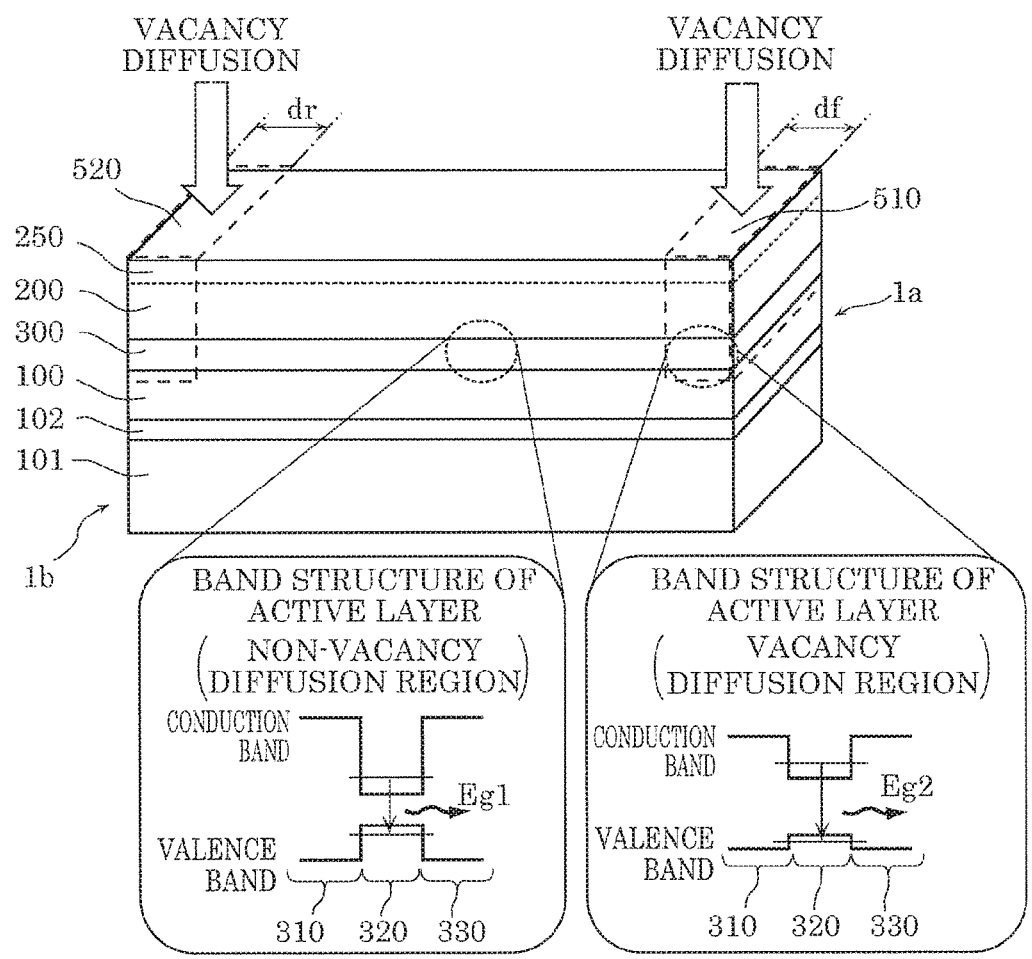
FIG. 3 schematically illustrates a structure of active layer 300 and layers around active layer 300 in semiconductor laser device 1 according to Embodiment 1.

The following describes a structure of active layer 300 and layers around active layer 300 of semiconductor laser device 1, with reference to FIG. 3. FIG. 3 schematically illustrates a structure of active layer 300 and layers around active layer 300 of semiconductor laser device 1 according to Embodiment 1. Note that first reflection film 410 and second reflection film 420 are omitted from FIG. 3.

In the present embodiment, the stacked structure of semiconductor laser device 1 has window-mirror structures in both end portions in the lengthwise direction of the resonator. Specifically, windows are formed in a region having length df from front end face 1a and a region having length dr from rear end face 1b in current noninjection regions close to both end faces of the optical waveguide in active layer 300, as illustrated in FIG. 3.

Here, if Eg1 denotes peak energy of photoluminescence in a region of active layer 300 in which a window is not formed, Eg2 denotes peak energy of photoluminescence in a region of active layer 300 in which a window is formed, and ΔEg denotes a difference between Eg1 and Eg2, a window is formed such that the relation ΔEg=Eg2−Eg1=100 meV is satisfied, for example. Specifically, the band gap of active layer 300 in the regions close to front end face 1a and rear end face 1b is made greater than the band gap of active layer 300 in regions other than those close to rear end face 1b and front end face 1a.

Generally, methods for forming windows include impurity diffusion and vacancy diffusion, and in the present embodiment, windows are formed by vacancy diffusion. This is because in a semiconductor laser device which makes super-high output of more than 10 W per emitter, it is important to decrease the amount of absorbed light by reducing loss. Specifically, if windows are formed by impurity diffusion, it is difficult to reduce loss due to light absorption since impurities result in an increase in absorbed light, yet vacancy diffusion does not use impurities, and thus loss due to light absorption resulting from introduction of impurities can be eliminated by forming windows by vacancy diffusion. As window-mirror structures, first vacancy diffusion region 510 is formed on the front end face 1a side, and second vacancy diffusion region 520 is formed on the rear end face 1b side by forming windows by vacancy diffusion, as illustrated in FIG. 3. Note that in FIG. 3, the regions indicated by the clashed lines show first vacancy diffusion region 510 and second vacancy diffusion region 520.

The vacancy diffusion allows forming windows by high-temperature rapid processing, so called impurity free vacancy disordering (IFVD). For example, exposure to very high temperature heat in a range from 800° C. to 950° C., which is near a crystal growth temperature, diffuses Ga vacancies to make active layer 300 into a mixed crystal, whereby the quantum well structure of active layer 300 becomes disordered, and a window (transparency) can be achieved by counter diffusion of the holes and group III elements.

As described above, windows are formed at both end portions of semiconductor laser device 1 in the lengthwise direction of the resonator, so that transparency of end faces of the resonator of semiconductor laser device 1 can be achieved, thus reducing light absorption near front end face 1a. Accordingly, the occurrence of COD can be inhibited at front end face 1a.

The following describes characteristics of semiconductor laser device 1 having such a configuration, in comparison with a semiconductor laser device according to a comparative example. Note that the semiconductor laser device according to the comparative example has a straight stripe structure in which taper angle θ of opening 221 of second semiconductor layer 220 (current blocking layer) is 0° in semiconductor laser device 1.

Figures 4A, 4B:
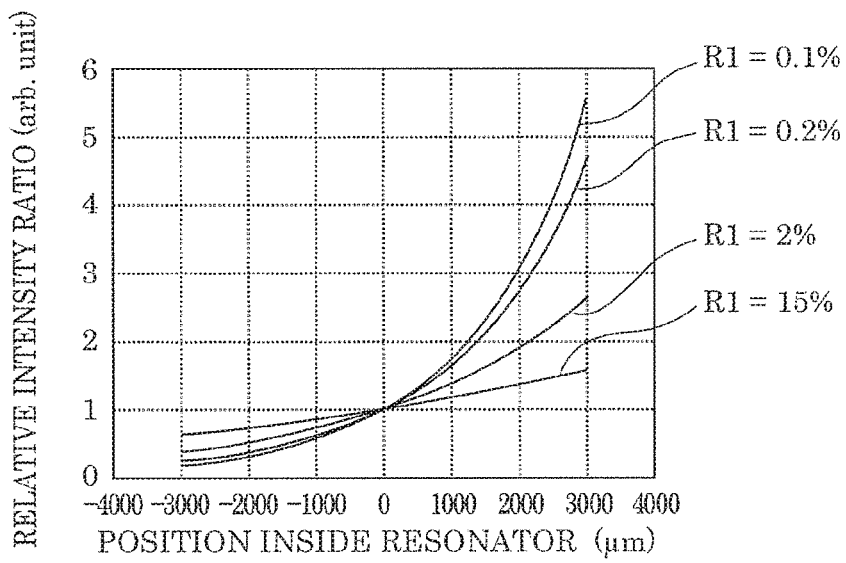
FIG. 4A illustrates dependency of a light intensity distribution on a reflectance of an end face, in the longitudinal direction of an optical waveguide in a semiconductor laser device according to a comparative example.
FIG. 4B illustrates a ratio of field intensities of the front end face and the rear end face when a reflectance of the front end face is changed, in the semiconductor laser device according to the comparative example.

First, dependency of light intensity distribution (electric field strength) on reflectance of end faces, in the longitudinal direction of the optical wavecuide in the semiconductor laser device according to the comparative example is to be described with reference to FIGS. 4A and 4B. Note that in FIGS. 4A and 4B, length L of the resonator of the semiconductor laser device is 6 mm, and reflectance R2 on the rear end face 1b side is 95%. FIG. 4A illustrates the relative intensity normalized such that the intensity of the optical waveguide in the center portion is 1, and FIG. 4B illustrates specific numerical values in FIG. 4A.

As can be seen from FIGS. 4A and 4B, front end face 1a has remarkably high light intensity (field intensity) when reflectance R1 on the front end face 1a side is low. Accordingly, with regard to carriers (electrons, holes) injected into active layer 300, the amount of operation carriers on the front end face 1a side consumed per unit time by stimulated emission is remarkably increased, and spatial hole burning occurs.

In this case, taper angle θ of opening 221 of second semiconductor layer 220 (current blocking layer) is increased from 0°, opening width S1 of opening 221 on the front end face 1a side is increased, the width of horizontal light distribution is increased, and light density is decreased.

Accordingly, the number of electrons and holes consumed per unit time by stimulated emission decreases on the front end face 1a side with an increase in taper angle θ. In contrast, horizontal spread of the light distribution is narrowed on the rear end face 1b side with an increase in taper angle θ, and light density increases. Accordingly, the number of electrons and holes consumed per unit time by stimulated emission increases on the rear end face 1b side with an increase in taper angle θ. As a result, if taper angle θ is excessively increased, the density of operation carriers in active layer 300 decreases on the rear end face 1b side, and spatial hole burning occurs.

If the degree of spatial hole burning increases, in a region where the density of operation carriers in active layer 300 is high, more carries overflow by leaking out from active layer 300 to cladding layers (first semiconductor layers 110 and 210) by being thermally excited, and the heat saturation level of light output decreases.

Furthermore, the occurrence of spatial hole burning in the longitudinal direction (the lengthwise direction of the resonator) causes variation in wavelength at which most amplified gain is obtained within active layer 300, thus leading to an increase in oscillation threshold current. If an oscillation threshold current increases, overflow of carriers during high temperature operation increases, and deterioration of temperature characteristics occurs.

The following describes an influence of a carrier distribution on the order of a high-order optical transverse mode (horizontal optical transverse mode) of light which propagates in the optical waveguide.

As in semiconductor laser device 1 according to the present embodiment, if opening width S2 on the rear end face 1b side is narrower than opening width S1 on the front end face 1a side in opening 221 of second semiconductor layer 220 (current blocking layer), light having a high-order optical transverse mode cannot be guided in the optical waveguide and thus is cut off, so that the number of optical transverse modes decreases.

The order of an optical transverse mode is limited by a formed optical waveguide, that is, the opening width defined by opening 221 of second semiconductor layer 220. Specifically, the order of an optical transverse mode is limited by narrowest opening width S2 among the widths of opening 221 of second semiconductor layer 220, and thus the order of an optical transverse mode which can be guided is determined.

When optical transverse modes are combined during laser oscillation, it is estimated that the light distribution shapes in the longitudinal direction of the optical waveguide influence each other, and change as optical transverse modes of light which can be oscillated simultaneously have lower orders, and nonlinearity arises in current-light output chacteristics.

Figure 5:
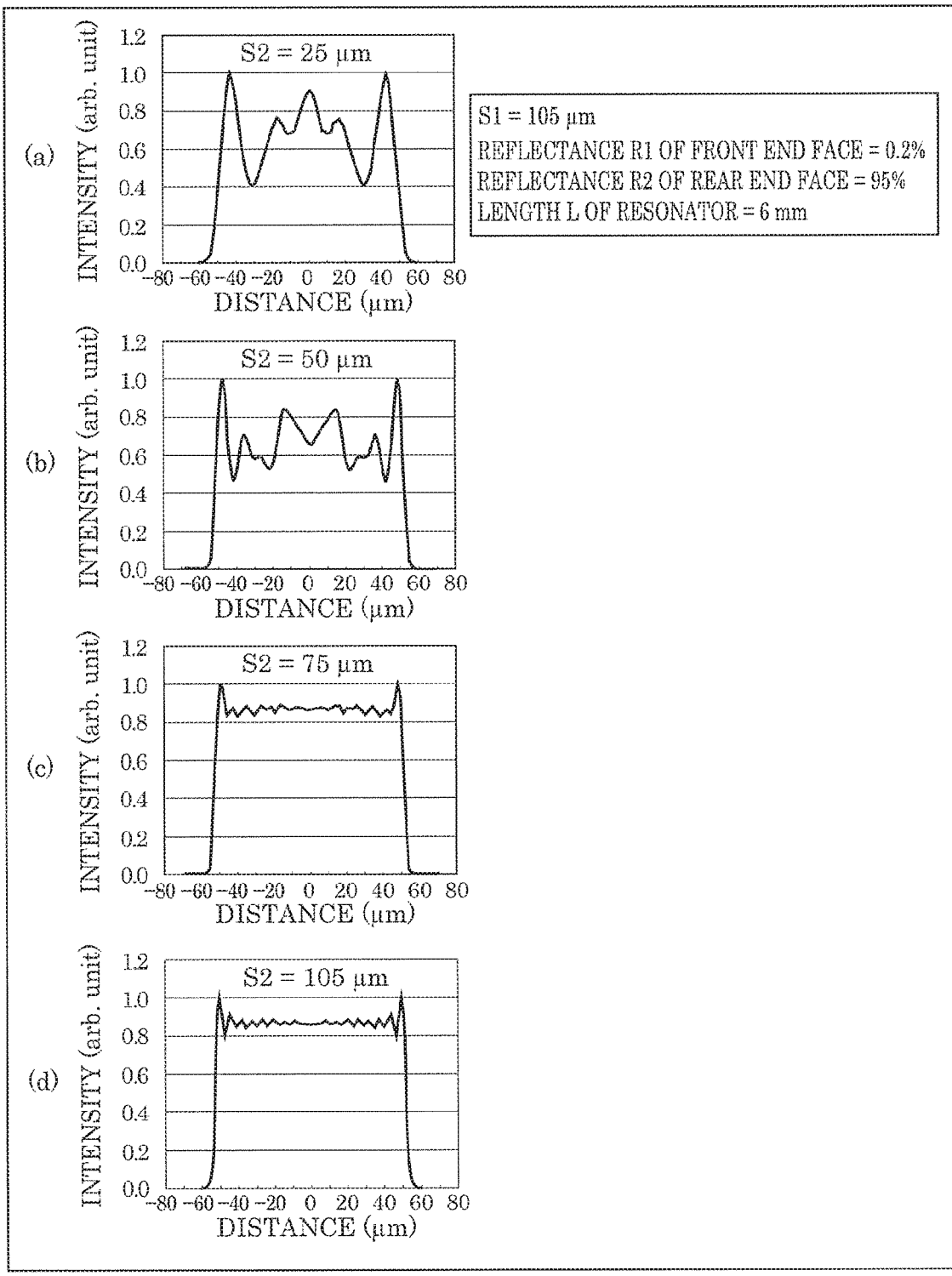
FIG. 5 illustrates dependency of a near field pattern on opening widths S1 and S2 during 10-W operation per emitter in the semiconductor laser device according to Embodiment 1.

With regard to this point, a simulation has been conducted on the dependency between opening width S2 on the rear end face 1b side and the order of an optical transverse mode, and the result is to be described with reference to FIG. 5. FIG. 5 illustrates shapes of a near field pattern (NFP) when opening width S2 of opening 221 of second semiconductor layer 220 on the rear end face 1b side is changed to 25 μm, 50 μm, 75 μm, and 105 μm in semiconductor laser device 1, when operation output per emitter is 10 W when length L of the resonator is 6 mm, reflectance R1 on the front end face 1a side is 0.2%, reflectance R2 on the rear end face 1b side is 95%, and opening width S1 of opening 221 of second semiconductor layer 220 on the front end face 1a side is fixed to 105 μm. Note that the case where S1=S2=105 μm shows a straight stripe structure having taper angle θ of 0°.

As illustrated in (a) of FIG. 5, a high-order optical transverse mode, that is, a maximum of 5th-order optical transverse mode is present when S2=25 μm. As illustrated in (b) of FIG. 5, a high-order optical transverse mode, that is, a maximum of 10th-order optical transverse mode is present where S2=50 μm. As illustrated in (c) of FIG. 5, a high-order optical transverse mode, that is, a maximum of 15th-order optical transverse mode is present when S2=75 μm. As illustrated in (d) of FIG. 5, a high-order optical transverse mode, that is, a maximum of 21st-order optical transverse mode is present when S2=105 μm (in the case of the straight stripe structure).

Accordingly, this shows that if opening width S2 is changed while opening width S1 is fixed (or in other words, if taper angle θ is changed), a high-order optical transverse mode significantly changes depending on opening width S2. Specifically, as can be seen from FIG. 5, if opening width S2 decreases, the near field pattern on front end face 1a has a shape that reflects a decrease in the order of a high order optical transverse mode.

Figure 6:
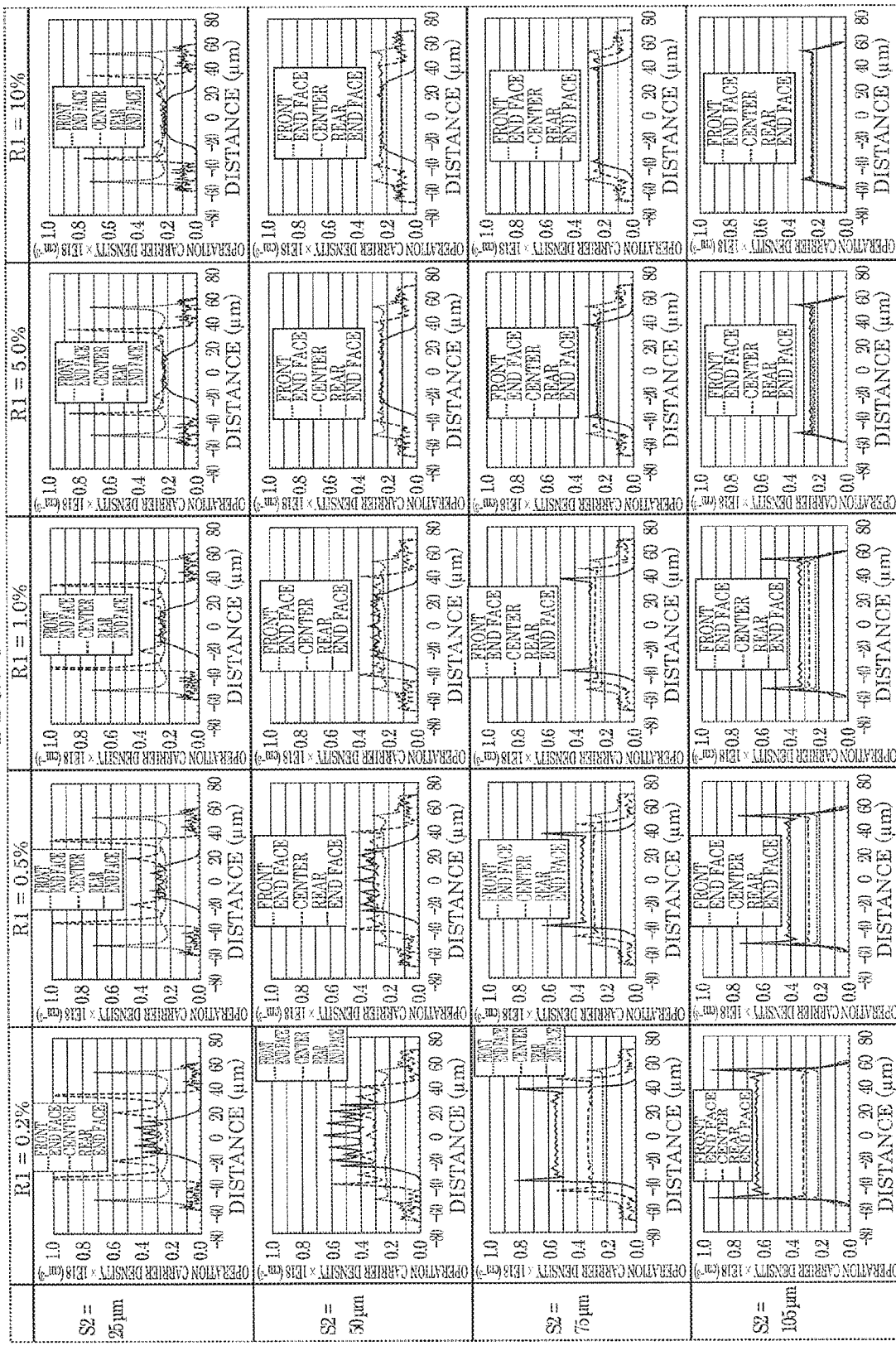
FIG. 6 illustrates a relation between distributions of the carrier concentration at the front end face, the center portion, and the rear end face of an optical waveguide in the width direction in the active layer, opening width S2 of an opening in the second semiconductor layer, and reflectance R1 of the front end face, in the semiconductor laser device according to Embodiment 1.

The following describes a relation between (i) distributions of the concentration of carriers in the width direction in active layer 300 at front end face 1a, a center portion, and rear end face 1b of an optical waveguide and (ii) opening width S2 of opening 221 of second semiconductor layer 220 and reflectance R1 of front end face 1a, with reference to FIG. 6. Note that in FIG. 6, opening width S2 and reflectance R1 of front end face 1a are changed when opening width S1 of opening 221 of second semiconductor layer 220 is set to 105 μm and reflectance R2 of rear end face 1b is set to 95%.

As illustrated in FIG. 6, when reflectance R1 of front end face 1a is 10%, since R1 is high, the average concentration of carriers of front end face 1a, a center portion, and rear end face 1b of the optical waveguide does not significantly vary, irrespective of the value of R2. Specifically, it can be seen that in this case, the shape of opening 221 of second semiconductor layer 220 does not exert much influence.

On the other hand, a difference in light intensity of the optical waveguide in the longitudinal direction is increased with a decrease in reflectance R1 of front end face 1a. For example, when reflectance R1 is 0.2%, if opening width S2 is 105 μm (straight stripe), unevenness of electrons and holes consumed per unit time by stimulated emission in the longitudinal direction of the optical waveguide is increased. Nevertheless, as opening width S2 decreases, light distribution is increased in the direction toward front end face 1a so that light density decreases. Accordingly, with regard to electrons and holes consumed per unit time by stimulated emission, it can be seen that the concentration of carriers near the center portion of the width at front end face 1a, the center portion, and rear end face 1b becomes more even. This is because if horizontal transverse modes of light guided in the optical waveguide include high-order multi-modes, a distribution of the amount of electrons and holes injected into active layer 300 consumed per unit time by stimulated emission becomes even in the longitudinal direction of the optical waveguide, by causing the shape of opening 221 of second semiconductor layer 220 to have the relation S1>S2. Specifically, efficiency of injecting electrons and holes into active layer 300 can be improved in the longitudinal direction of the optical waveguide. Accordingly, a threshold current for laser oscillation can be decreased, and thus a driving current can be reduced. In this manner, the greater a difference (R1/R2 ratio) in reflectance between end faces, the more effects are achieved by the shape (S1>S2) of opening 221 of second semiconductor layer 220.

However, when the order of a high-order optical transverse mode is excessively decreased or, for example, in the case where opening width S2 is 25 μm and reflectance R1 is 0.2% in FIG. 6, when the high-order optical transverse mode is cut off and the order of the high-order optical transverse mode is excessively decreased due to opening width S2 (25 μm), a large peak arises in carrier distribution at end portions in the width direction of opening 221 of second semiconductor layer 220 due to carriers not consumed. This means that spatial hole burning in the transverse direction has occurred. Specifically, it has verified that the occurrence of spatial hole burning in the transverse direction could not be inhibited by merely causing the shape of opening 221 of second semiconductor layer 220 to satisfy the relation S1>S2.

From the results of the above verification, by setting S2 to a value in a range from 25 μm to 50 μm if S1=105 μm, a difference in the intensity of carrier distributions on the front end face, the center, and the rear end face can be decreased in the longitudinal direction of the optical waveguide, and efficiency of injecting carriers can be maximized, so that the occurrence of spatial hole burning in the transverse direction can be more effectively inhibited. If S2/S1 which is a ratio (opening width ratio) of opening widths S1 and S2 is used to state the above differently, efficiency of injecting carriers can be maximized by adopting the relation $0.238 \leq S2/S1 \leq 0.476$. Thus, the examination made by the inventors of the present application first verified that the efficiency of injecting carriers can be maximized by causing the shape of opening 221 of second semiconductor layer 220 to satisfy the relation $0.238 \leq S2/S1 \leq 0.476$.

Figure 7:
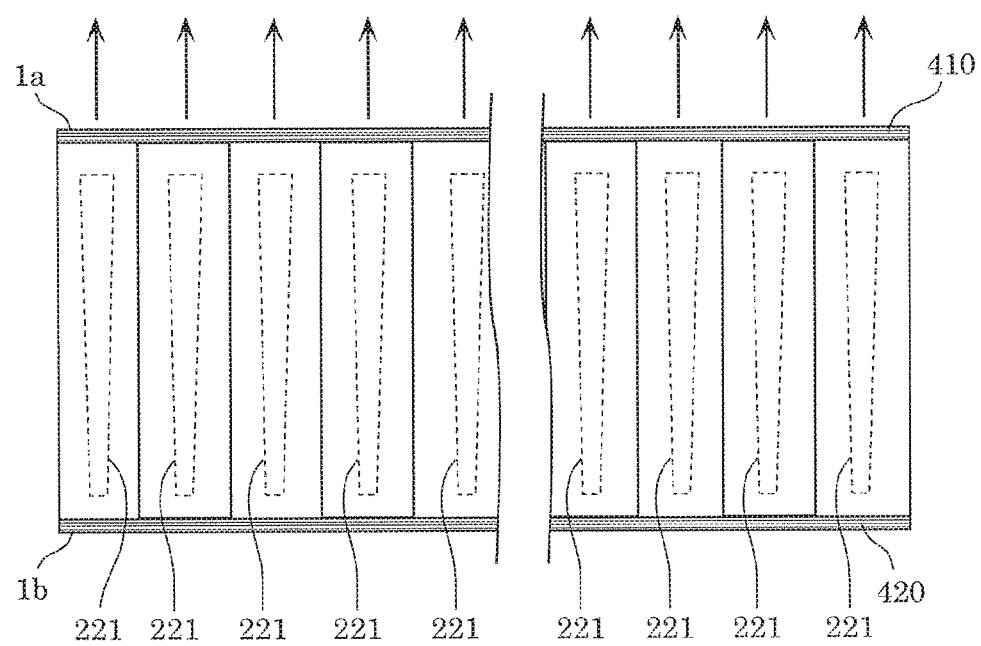
FIG. 7 is a plan view illustrating a configuration of a semiconductor laser device according to an example of Embodiment 1.
Figure 8A:
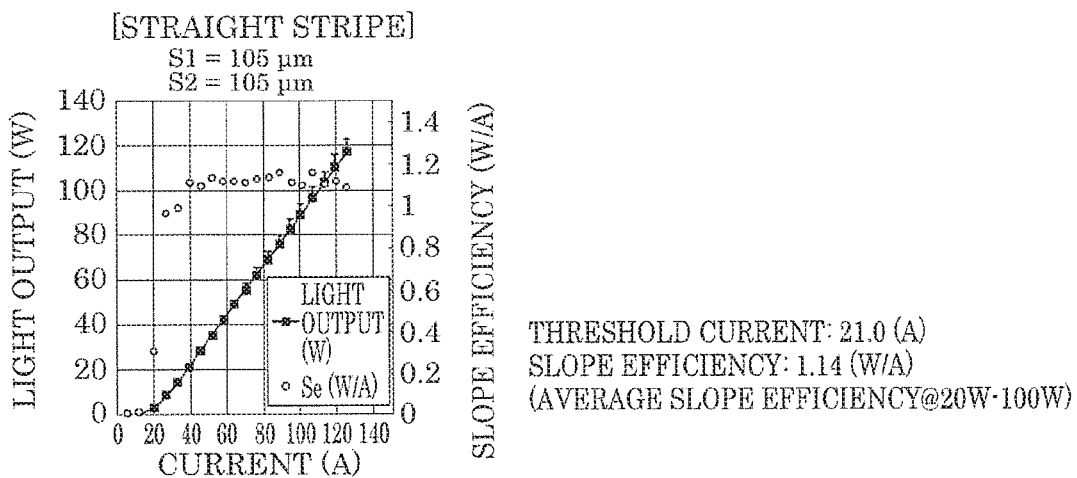
FIG. 8A illustrates current-light output characteristics of the semiconductor laser device (S1=S2=105 μm) according to the example of Embodiment 1.
Figure 8B:
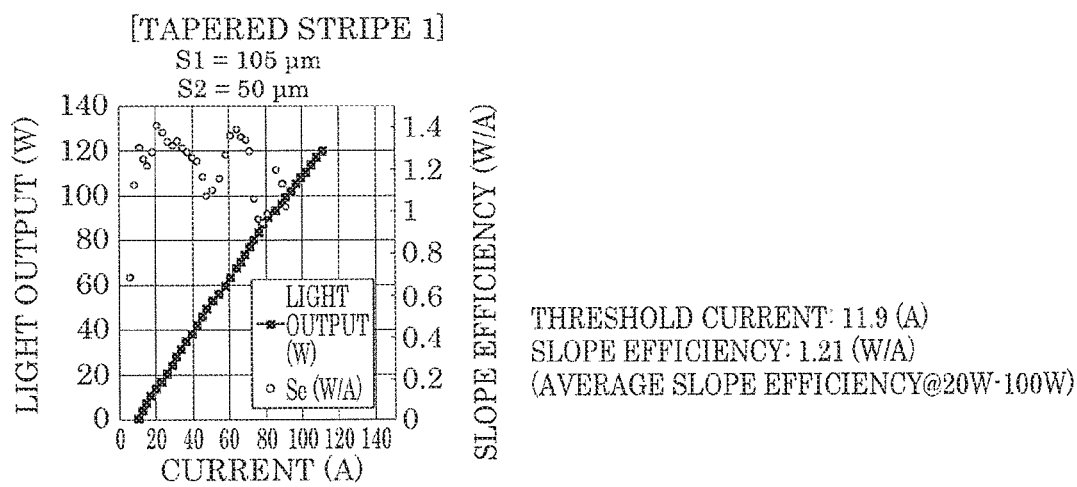
FIG. 8B illustrates current-light output characteristics of the semiconductor laser device (S1=105 μm, S2=50 μm) according to the example of Embodiment 1.
Figure 8C:
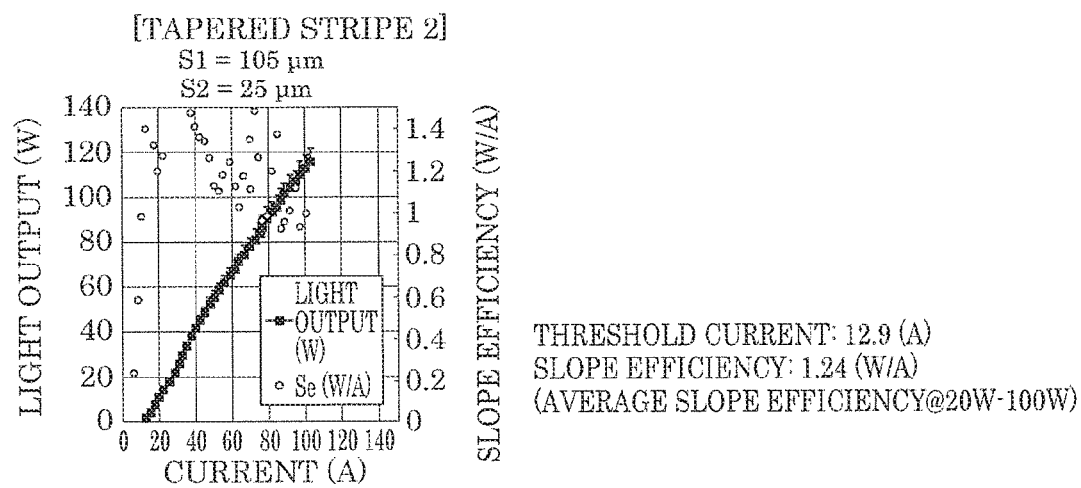
FIG. 8C illustrates current-light output characteristics of the semiconductor laser device (S1=105 μm, S2=25 μm) according to the example of Embodiment 1.

Next, based on the result of the above verification, a semiconductor laser device was actually produced as an example, and characteristics of the semiconductor laser device were evaluated. The result of the evaluation is described with reference to FIGS. 7 and 8A to 8C. FIG. 7 is a plan view illustrating a configuration of a semiconductor laser device according to the example of Embodiment 1. FIGS. 8A to 8C illustrate current-light output characteristics of the semiconductor laser device according to the example of Embodiment 1.

As illustrated in FIG. 7, the semiconductor laser device according to the example of Embodiment 1 has a multi-emitter structure which includes emitters and in which 20 openings 221 are formed parallel to each other in the lengthwise direction of the optical waveguide in second semiconductor layer 220. In the semiconductor laser device according to the example illustrated in FIG. 7, the structure of each emitter is equivalent to that of semiconductor laser device 1 illustrated in FIGS. 1 to 3.

FIG. 8A illustrates current-light output characteristics of the semiconductor laser device according to the example in FIG. 7 when the shape of openings 221 of second semiconductor layer 220 is defined by S1=S2=105 μm (straight stripe structure: S2/S1=1). In this case, the threshold current was 21.0 A, and the average slope efficiency (Se) was 1.14 W/A.

FIG. 8B illustrates current-light output characteristics of the semiconductor laser device according to the example in FIG. 7 when the widths of openings 221 of second semiconductor layer 220 are S1=105 μm and S2=50 μm (taper stripe structure: S2/S1=0.476). In this case, the threshold current was 11.9 A, and the average slope efficiency (Se) was 1.21 W/A.

FIG. 8C illustrates current-light output characteristics of the semiconductor laser device according to the example in FIG. 7 when the widths of openings 221 of second semiconductor layer 220 are S1=105 μm and S2=25 μm (taper stripe structure: S2/S1=0.238). In this case, the threshold current was 12.9 A, and the average slope efficiency (Se) was 1.24 W/A.

It can be seen from the comparison between FIGS. 8A, 8B, and 8C that change of the shape of openings 221 of second semiconductor layer 220 from the straight shape to the tapered shape can reduce the threshold current for laser oscillation, and also improves the average slope efficiency.

Furthermore, it can be seen from the comparison between FIGS. 8B and 8C that if the opening ratio of openings 221 of second semiconductor layer 220 indicated by S2/S1 is excessively decreased, advantageous effects of a decrease in threshold current and improvement in average slope efficiency are reduced.

In this manner, as shown by the result of the above verification, it was confirmed that if the opening ratio of openings 221 of second semiconductor layer 220 indicated by S2/S1 is $0.238 \leq S2/S1 \leq 0.476$, the threshold current can be reduced, and also the average slope efficiency improves.

This means that the spatial hole burning in the transverse direction is further inhibited and the efficiency of injecting carriers improves, by the shape of openings 221 of second semiconductor layer 220. It was able to be proved that in a semiconductor laser device which produces high-order multi-transverse mode laser oscillation (that is, multi-transverse mode oscillation), the shape of openings 221 of second semiconductor layer 220 is made into a tapered shape, whereby efficiency of injecting carriers (electrons and holes)

can be improved in the longitudinal direction of the optical waveguide with respect to the light intensity (field intensity) in the optical waveguide.

Here, with regard to the relation between taper angle θ of openings 221 of second semiconductor layer 220 and efficiency of injecting carriers, the case where the relation ratio between S1 and S2 of openings 221 of second semiconductor layer 220 is expressed using taper angle θ of openings 221 of second semiconductor layer 220 is to be examined.

Light loss (optical waveguide loss) within the optical waveguide may be reduced to improve efficiency of injecting carriers while inhibiting spatial hole burning in the longitudinal direction and spatial hole burning in the transverse direction. Here, light loss α of the semiconductor laser device is generally expressed by Expressions (a) and (b) as below.

Light loss $\alpha$=mirror loss $\alpha_m$+optical waveguide loss $\alpha_i$+free carrier loss $\alpha_{free}$     (a)

Optical waveguide loss $\alpha_i$=optical absorption loss $\alpha'_i$+taper loss $\alpha_{Taper}$     (b)

In Expressions (a) and (b), taper angle θ of opening 221 of second semiconductor layer 220 influences taper loss $\alpha_{Taper}$.

When taper angle θ is 0°, the optical waveguide has a straight shape, and thus taper loss $\alpha_{Taper}$ is the lowest. Taper loss $\alpha_{Taper}$ increases with an increase in taper angle θ. Specifically, from the result of the above verification, unless angle θ satisfies the relation S2/S1≥0.238, taper loss $\alpha_{Taper}$ in Expression (b) increases, and the threshold current remarkably increases.

As described above, taper angle θ is an angle between the lengthwise direction of the resonator (the longitudinal direction of the optical waveguide) and a straight line which connects an end of the opening width on the front end face 1a side and an end of the opening width on the rear end face 1b side in opening 221 of second semiconductor layer 220, as illustrated in FIG. 2.

Accordingly, when the length of the resonator of semiconductor laser device 1 is L, taper angle θ, length L of the resonator, and opening widths S1 and S2 of second semiconductor layer 220 satisfy the relation indicated by Expression (c).

$$\tan\theta=(S1-S2)/(2\times L) \quad (c)$$

Thus, in the case of FIG. 8A (S=S2=105 μm), taper angle θ is 0°, in the case of FIG. 8B (S1=105 μm, S2=50 μm), taper angle θ is approximately 0.25°, and in the case of FIG. 8C (S1=105 μm, S2=25 μm), taper angle θ is approximately 0.38°.

Figure 9:
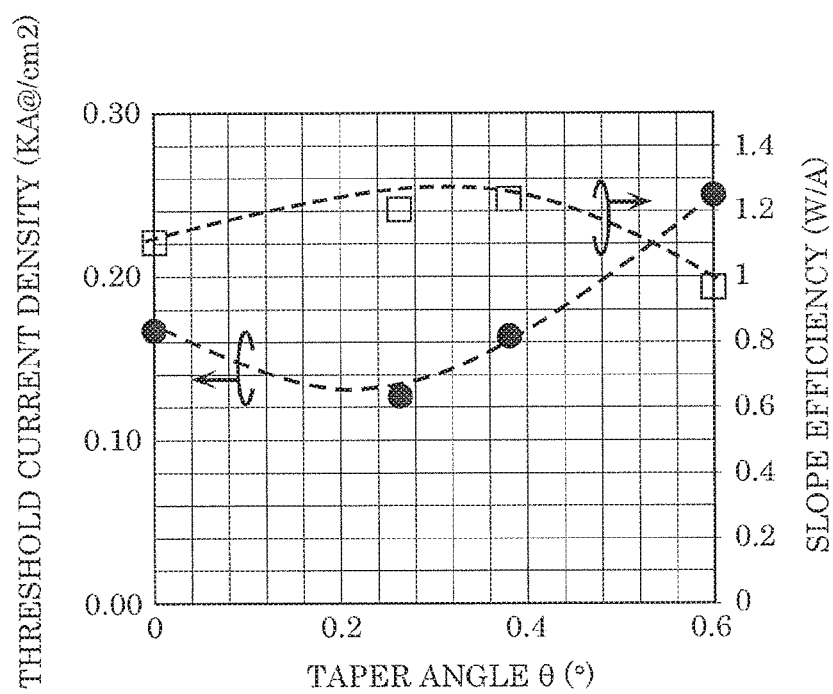
FIG. 9 illustrates a relation between (i) taper angle θ of the opening in the second semiconductor layer and (ii) threshold current density and slope efficiency in the semiconductor laser device according to the example of Embodiment 1.

If the dependency of taper angle θ on the threshold current and the average slope efficiency is obtained based on the above, the result is as illustrated in FIG. 9. FIG. 9 illustrates a relation between (i) taper angle θ of opening 221 of second semiconductor layer 220 and (ii) the threshold current density and slope efficiency in the semiconductor laser device according to the example.

As can be seen from FIG. 9, the threshold current density can be reduced and also the average slope efficiency improves with an increase in taper angle θ, as compared to a straight stripe structure having taper angle θ of 0°. This means that efficiency of using carriers is improved by forming opening 221 of second semiconductor layer 220 into a tapered shape.

If taper angle θ is further increased, when taper angle θ is in a range from approximately 0.22° to approximately 0.32°, the threshold current density gradually increases from the smallest value, yet the average slope efficiency increases. This is because the threshold current density is considered to be increased by an increase in the taper loss, which is one of the optical waveguide losses, with an increase in taper angle θ. Furthermore, with regard to an increase in the average slope efficiency, this is because a light intensity distribution in an optical waveguide is made more even and carriers injected into the active layer are made more even as taper angle θ increases, so that efficiency of using carriers in the longitudinal direction of the optical waveguide has further increased in a stimulated emission process per unit time.

If taper angle θ further increases and exceeds approximately 0.5°, the threshold current density further increases, and also average slope efficiency significantly decreases. In other words, if taper angle θ is excessively large, the effect of decrease in threshold current density and the effect of improvement in average slope efficiency deteriorate. The cause of this is considered to be as follows: a great increase in taper loss which is one of the optical waveguide losses causes an increase in threshold current density, and the influence of increase in the taper loss is greater than an improvement in the efficiency of using carriers in the active layer in the longitudinal direction of the optical waveguide, thus decreasing slope efficiency.

From the above, a suitable range of taper angle θ is a range in which influence of taper loss $\alpha_{Taper}$ is as small as possible, that is, a range indicated by Expression (d) below.

$$0°<\theta\leq 0.5° \quad (d)$$

Thus, it was first confirmed that if a semiconductor laser device is not produced using taper angle θ in a range which satisfies Expression (d), influence due to taper loss $\alpha_{Taper}$ notably appears.

If taper angle θ is further increased, an increase in taper loss $\alpha_{Taper}$ causes a further increase in threshold current and a further decrease in average slope efficiency. Accordingly, even if electrons and holes which are carriers are injected according to the light intensity distribution within the optical waveguide in the longitudinal direction, an increase in threshold current and a decrease in average slope efficiency due to an increase in optical waveguide loss $\alpha_i$ result in a decrease in the efficiency of current-light output characteristics. Accordingly, it is necessary to appropriately set taper angle θ of opening 221 of second semiconductor layer 220.

By satisfying the condition indicated by Expression (d), the spatial hole burning in the longitudinal direction and the spatial hole burning in the transverse direction can be inhibited, and influence due to taper loss $\alpha_{Taper}$ can be minimized.

Figure 10:
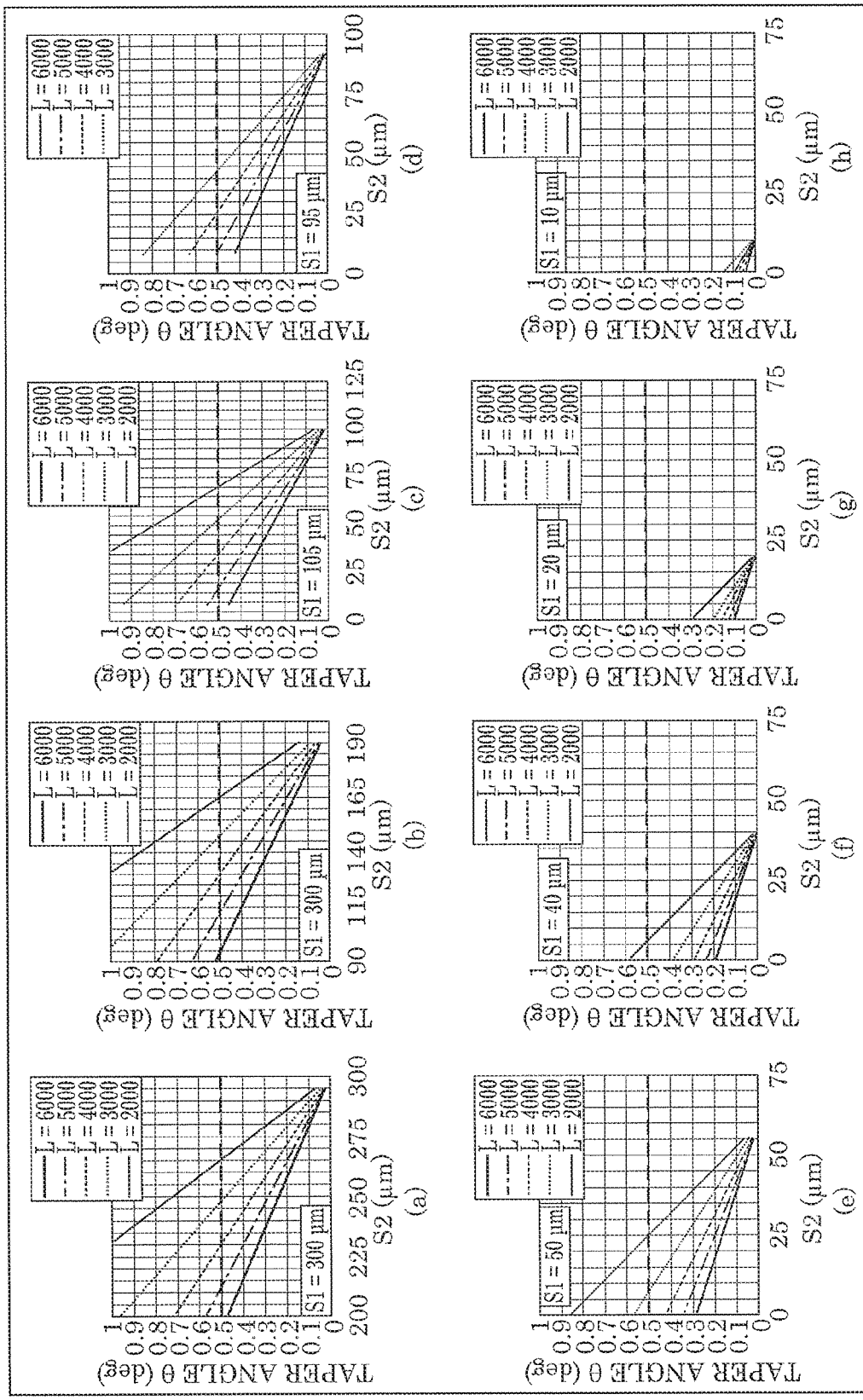
FIG. 10 illustrates combinations of opening widths S1 and S2, length L of a resonator, and taper angle θ in the semiconductor laser device according to Embodiment 1.

In view of this, FIG. 10 illustrates combinations of opening widths S1 and S2, length L of the resonator, and taper angle θ in a semiconductor laser device according to the present embodiment which produces horizontal multi-transverse mode oscillation. In (a) to (h) of FIG. 10, the horizontal axis indicates opening width S2, whereas the vertical axis indicates taper angle θ, when S1=300 μm, 200 μm, 105 μm, 95 μm, 60 μm, 40 μm, 20 μm, and 10 μm, if length L of the resonator is changed to 2000 μm, 3000 μm, 4000 μm, 5000 μm, and 6000 μm. Note that (a) to (h) of FIG. 10 illustrate the boundary line indicating taper angle θ of 0.5° with dashed lines.

As illustrated in (a) to (h) of FIG. 10, the relation indicated by Expression (c) is maintained and a range which satisfies the condition indicated by Expression (d) is selected, whereby the spatial hole burning in the longitudinal direction and the spatial hole burning in the transverse direction can be inhibited, and influence of taper loss $\alpha_{Taper}$ can be minimized.

Note that the spatial hole burning in the longitudinal direction and the spatial hole burning in the transverse direction can be inhibited and influence of taper loss $\alpha_{Taper}$ can be minimized, if the relation indicated by Expression (c) is maintained and a range which satisfies the condition indicated by Expression (d) is selected although the range is outside the ranges illustrated in FIG. 10.

As stated above, semiconductor laser device 1 according to the present embodiment is a semiconductor laser device which produces multi-transverse mode oscillation, and includes: a stacked structure in which first conductivity side semiconductor layer 100, active layer 300, and second conductivity side semiconductor layer 200 are stacked in stated order. The stacked structure includes: front end face 1a from which laser light emitted by the semiconductor laser device exits; rear end face 1b opposite the front end face; and an optical waveguide for which front end face 1a and rear end face 1b are used as reflection mirrors of a resonator. Second conductivity side semiconductor layer 200 includes first semiconductor layer 210 and second semiconductor layer 220, first semiconductor layer 210 being closer to active layer 300 than second semiconductor layer 220 is. Second semiconductor layer 220 defines a width of a current injection region for injecting current into the optical waveguide. End portions of the current injection region in a lengthwise direction of the resonator are located on an inner side relative to front end face 1a and rear end face 1b. The current injection region includes a width varying region in which a width varies. S1>S2, where S1 denotes a width of the width varying region on a front end face 1a side closer to front end face 1a, and S2 denotes a width of the width varying region on a rear end face 1b side closer to rear end face 1b.

Accordingly, since semiconductor laser device 1 produces multi-transverse mode oscillation, semiconductor laser device 1 can produce high-output laser oscillation which cannot be achieved by a semiconductor laser device which produces single mode oscillation, and also can be driven at a low voltage by increasing utilization efficiency of injected carriers. Moreover, the current injection region includes the width varying region which satisfies S1>S2, and thus light intensity is spread and made even in the transverse direction as closer to front end face 1a, and also light density on end faces can be decreased, so that the occurrence of COD on front end face 1a can be inhibited. Accordingly, a high-output semiconductor laser device which can be driven at a low voltage while inhibiting occurrence of COD can be achieved.

In semiconductor laser device 1 according to the present embodiment, $0°<\theta\leq 0.5°$ may be satisfied, where θ denotes an angle between the lengthwise direction of the resonator and a straight line which connects a widthwise end of the width varying region on the front end face 1a side and a widthwise end of the width varying region on the rear end face 1b side.

Accordingly, spatial hole burning in the longitudinal direction and spatial hole burning in the transverse direction can be inhibited, and low-voltage driving and high output can be achieved by improving the utilization efficiency of injected carriers as much as possible. Furthermore, an operation can be performed using a low current owing to a low threshold current and high slope efficiency.

Figure 11:
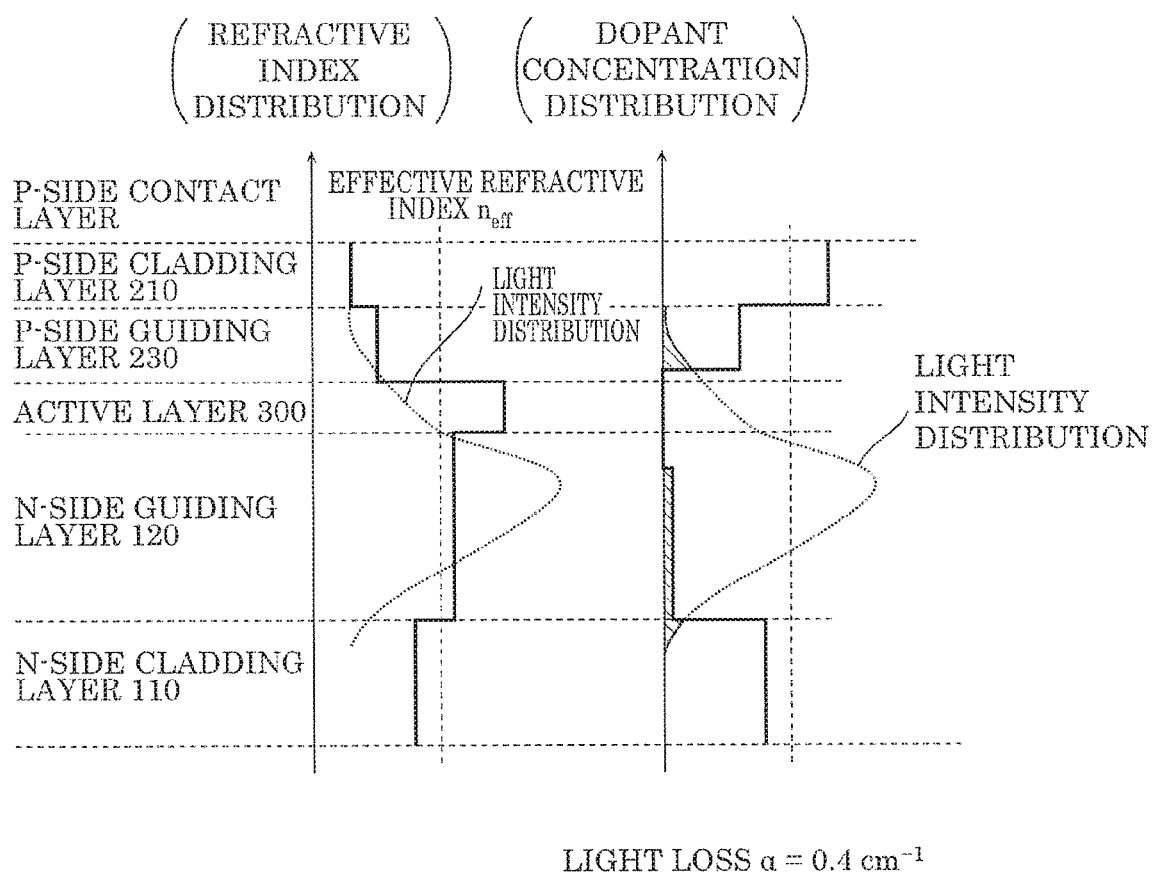
FIG. 11 is a schematic diagram illustrating profiles of a light distribution and a dopant concentration distribution in a structure of confining light in the longitudinal direction in the semiconductor laser device according to Embodiment 1.

In semiconductor laser device 1 according to the present embodiment, the highest light intensity of laser light emitted by semiconductor laser device 1 is present in n-side second semiconductor layer 120 (the first light guiding layer), as illustrated in FIG. 11. FIG. 11 is a schematic diagram illustrating profiles of a light distribution in the optical confinement structure in the longitudinal direction and a dopant concentration distribution, in semiconductor laser device 1 according to Embodiment 1.

As illustrated in FIG. 11, the highest light intensity of laser light is located on the n-side second semiconductor layer 120 side, and most of a light distribution in the longitudinal direction is located on n-side second semiconductor layer 120, whereby a total of optical waveguide loss $\alpha_i$ and free-carrier loss $\alpha_{free}$ is minimized and utilization efficiency of injected carriers into active layer 300 can be improved and increased as much as possible. Accordingly, this allows the semiconductor laser device to be driven at a low voltage using low current owing to a low threshold current and high slope efficiency, so that the semiconductor laser device which makes high output of tens of watts and shows high efficiency of power conversion can be achieved.

In semiconductor laser device 1 according to the present embodiment, a thickness of first semiconductor layer 210 in a region under the current injection region is same as a thickness of first semiconductor layer 210 in a region under second semiconductor layer 220.

This configuration allows the laser structure of semiconductor laser device 1 to be an inner-stripe structure, so that current can be confined only by second semiconductor layer 220. Accordingly, semiconductor laser device 1 can be driven at a low voltage, which cannot be achieved by a ridge wide stripe laser.

Note that in the semiconductor laser device according to the present embodiment, lengths df and dr near the end faces of the optical waveguide satisfy df=dr=50 μm, but are not limited thereto. For example, df and dr may be shorter than 50 μm, may be as long as about 100 μm, or may have the relation df≠dr.

In semiconductor laser device 1 according to the present embodiment, ΔEg which is a parameter for having the window-mirror structure satisfies ΔEg=100 meV, but is not limited thereto. As an example, even if 0 meV≤ΔEg≤200 meV, similar advantageous effects can be achieved.

Semiconductor laser device 1 according to the present embodiment has adopted vacancy diffusion as a method for forming the window-mirror structure, but the method is not limited thereto. For example, the window-mirror structure may be formed by impurity diffusion. In this case, for example, when Si is used as an impurity, Si may be diffused by ion implantation to make the active layer into a mixed crystal. When Zn is used as an impurity, ZnO is vapor-deposited on the upper surface of a p-side semiconductor layer in a region where a window is to be formed, and Zn may be diffused by thermal diffusion to make the active layer into a mixed-crystal.

In semiconductor laser device 1 according to the present embodiment, the theory was verified assuming that reflectances of first reflection film 410 and second reflection film 420 formed on front end face 1a and rear end face 1b, respectively, satisfy R1/R2=0.021, yet the present embodiment is not limited thereto. For example, R1 may be 10% and R2 may be 95% (R1/R2=0.1) from the result of the verification in FIG. 6. Similar effects can be yielded if R1/R2<0.1, and the smaller the value of R1/R2 is, the more advantageous effects can be obtained.

As long as first reflection film 410 can decrease reflectance R1 of front end face 1a and second reflection film 420 can increase reflectance R2 of rear end face 1b, the material of first reflection film 410 and second reflection film 420 is not limited to a combination of $Al_2O_3$, $SiO_2$, and $Ta_2O_5$, and may be an arbitrary combination of $ZrO_2$, $TiO_2$, SiN, BN, AlN, and $Al_xO_yN$ (x>y).

In semiconductor laser device 1 according to the present embodiment, n-side first semiconductor layer 110 (n-side cladding layer) has a three-layered structure which includes n-type first cladding layer 111 made of n-$Al_{0.15}Ga_{0.85}As$, n-type second cladding layer 112 made of n-$Al_{0.335}Ga_{0.665}As$, and n-type third cladding layer 113 made of n-$Al_{0.335}Ga_{0.665}As$, and in order to achieve an optical confinement structure and a decrease in absorption of free carriers, the Al ratios and impurity doping concentrations are increased/decreased according to a light distribution in the stacking direction, yet n-side first semiconductor layer 110 may have a multi-layer structure or a single-layer structure. Even if n-side first semiconductor layer 110 has a single layer structure, similar advantageous effects can be yielded.

In semiconductor laser device 1 according to the present embodiment, n-side second semiconductor layer 120 (n-side light guiding layer) has a three-layer structure which includes n-type first optical waveguide layer 121 made of n-$Al_{0.27}Ga_{0.73}As$, n-type second optical waveguide layer 122 made of n-$Al_{0.27}Ga_{0.73}As$, and n-type third optical waveguide layer 123 made of n-$Al_{0.25}Ga_{0.75}As$, so as to achieve a guiding layer structure in which the center of light distribution in the stacking direction is present, and Al ratios and impurity doping concentration are increased/decreased according to the light distribution in the stacking direction in order to reduce absorption of free carriers by highly accurately controlling light distribution, yet n-side second semiconductor layer 120 may have a multilayer structure or a single-layer structure. Even if n-side second semiconductor layer 120 has a single-layer structure, similar advantageous effects can be yielded.

In semiconductor laser device 1 according to the present embodiment, active layer 300 has a single quantum well structure in which first barrier layer 310 made of un-$Al_{0.25}Ga_{0.75}As$, well layer 320 made of un-$In_{0.17}Ga_{0.83}As$, and second barrier layer 330 made of un-$Al_{0.25}Ga_{0.75}As$ are stacked so as to achieve as much advantageous effects as possible, yet even if active layer 300 has a multi-quantum well structure which includes two or more quantum well structures, similar advantageous effects can be yielded.

In semiconductor laser device 1 according to the present embodiment, p-side first semiconductor layer 210 (p-side cladding layer) has a three-layer structure which includes p-type first cladding layer 211 made of p-$Al_{0.65}Ga_{0.35}As$, p-type second cladding layer 212 made of p-$Al_{0.65}Ga_{0.35}As$, and p-type third cladding layer 213 made of p-$Al_{0.15}Ga_{0.85}As$, and the highest intensity of light in the stacking direction and most of the light distribution are caused to be present in n-side second semiconductor layer 120 (n-side light guiding layer) by highly precisely controlling a refractive index, thus achieving an optical waveguide with which loss is extremely low (optical guide loss $\alpha_i$=0.5 $cm^{-1}$). Nevertheless, p-side first semiconductor layer 210 may have a multi-layer structure or a single-layer structure. Even if p-side first semiconductor layer 210 has a single-layer structure, similar advantageous effects can be achieved.

In semiconductor laser device 1 according to the present embodiment, a GaAs substrate is used as substrate 101, and layers of the stacked structure are formed on the GaAs substrate using a GaAs-based semiconductor material such as GaAs, AlGaAs, or InGaAs, yet the material of the stacked structure included in semiconductor laser device 1 is not limited to this.

For example, a GaN substrate may be used as substrate 101, and layers of stacked structure may be formed on the GaN substrate, using a nitride based semiconductor material such as GaN, AlGaN, InGaN, or AlGaInN.

Figure 12:
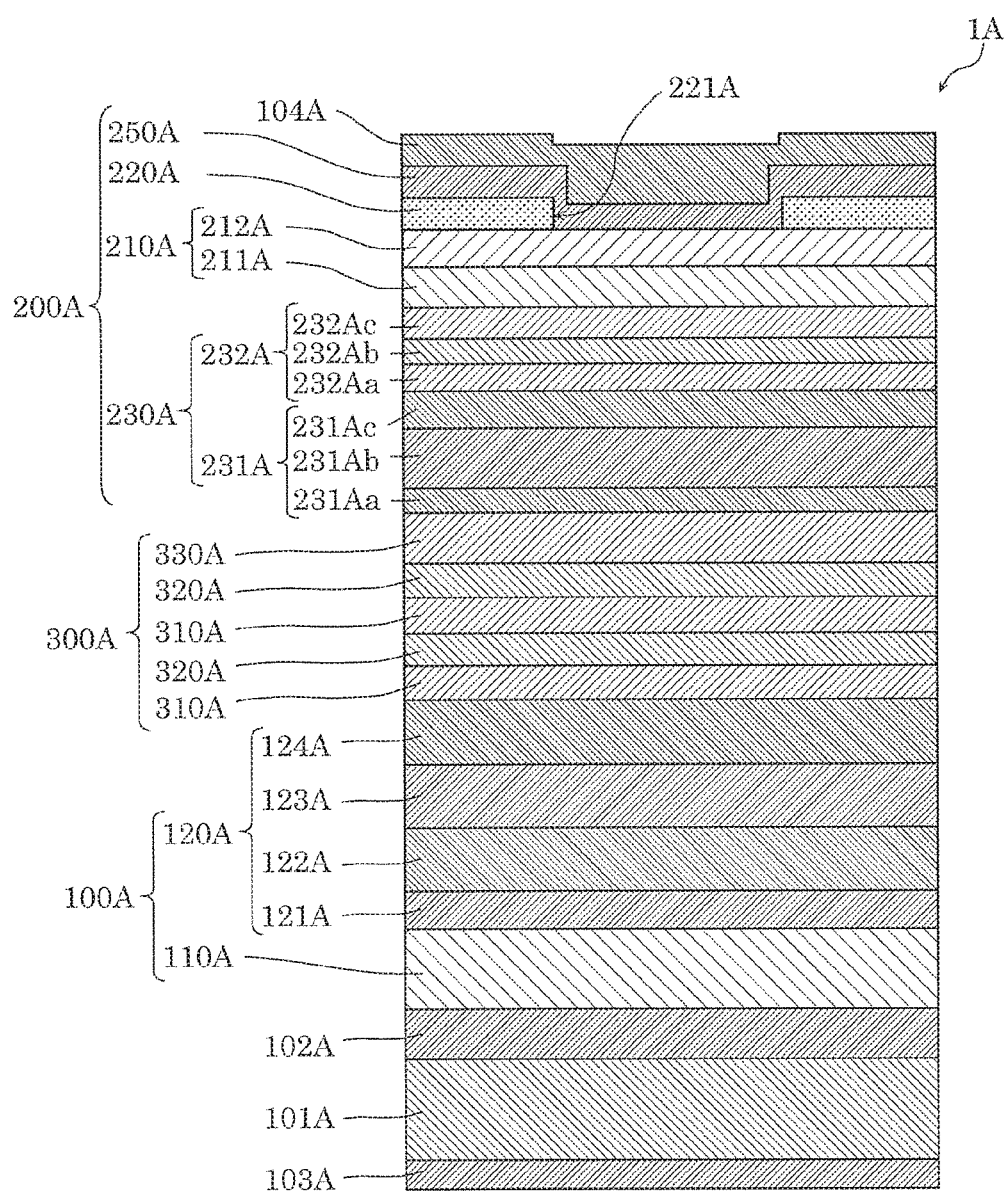
FIG. 12 is a cross-sectional view of a semiconductor laser device according to a variation of Embodiment 1.
Figure 13:
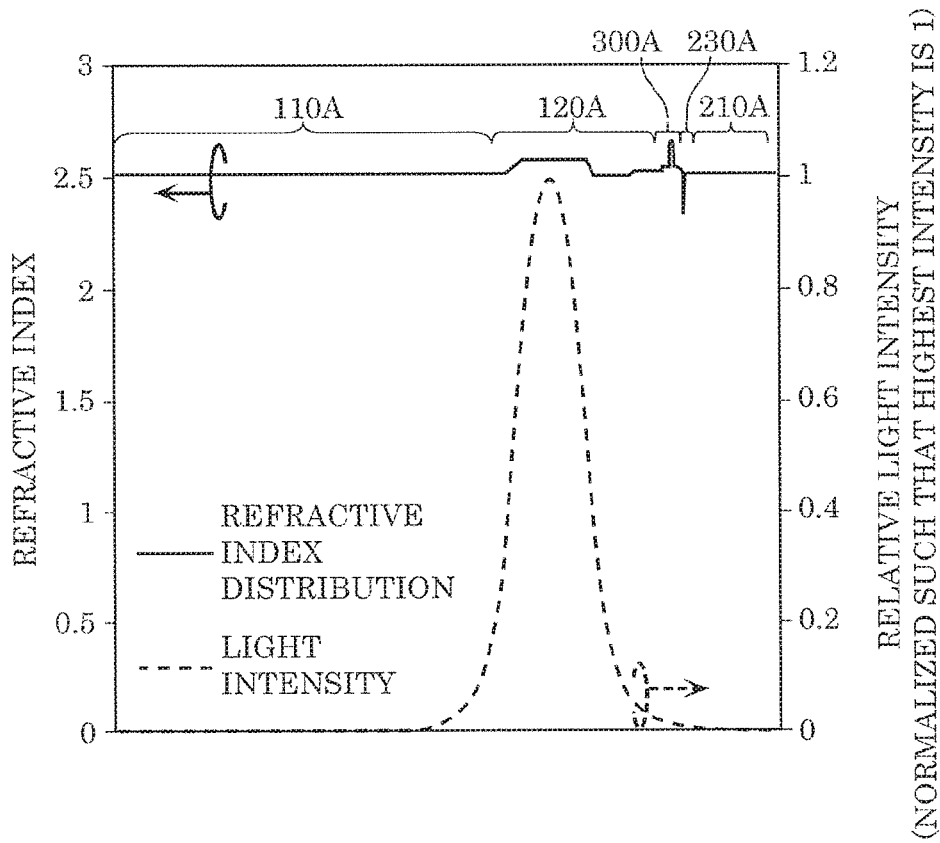
FIG. 13 illustrates a refractive index distribution and a light distribution in the stacking direction in an optical waveguide in the semiconductor laser device illustrated in FIG. 12.

As an example, semiconductor laser device 1A for which an $Al_xGa_{1-x-y}In_yN$ (0≤x≤1, 0≤y≤1) based material is used is to be described with reference to FIGS. 12 and 13. FIG. 12 is a cross-sectional view of semiconductor laser device 1A according to a variation of Embodiment 1. FIG. 13 illustrates a refractive index distribution and a light distribution in the stacking direction in an optical waveguide in semiconductor laser device 1A illustrated in FIG. 12.

As illustrated in FIG. 12, semiconductor laser device 1A is an edge-emitting laser device having a stacked structure in which first conductivity side semiconductor layer 100A, active layer 300A, and second conductivity side semiconductor layer 200A are stacked in the stated order, and emits laser light by producing multi-transverse mode oscillation.

Specifically, semiconductor laser device 1A includes substrate 101A, buffer layer 102A formed on the upper surface of substrate 101A, first conductivity side semiconductor layer 100A formed on buffer layer 102A, active layer 300A formed on first conductivity side semiconductor layer 100A, second conductivity side semiconductor layer 200A formed on active layer 300A, first electrode 103A formed on the undersurface of substrate 101A, and second electrode 104A formed on second conductivity side semiconductor layer 200A.

In this variation, substrate 101A is an n-GaN substrate. Buffer layer 102A is an n-GaN layer having a thickness of 1 µm, for example.

First conductivity side semiconductor layer 100A (n-side semiconductor layer) includes n-side first semiconductor layer 110A formed on buffer layer 102A, and n-side second semiconductor layer 120A formed on n-side first semiconductor layer 110A.

N-side first semiconductor layer 110A is an n-type cladding layer made of n-$Al_{0.026}Ga_{0.974}N$ and having a thickness of 3.7 µm.

N-side second semiconductor layer 120A is a first light guiding layer (having a total thickness of 1.04 µm) that is an n-side light guiding layer, and is a stacked film in which n-type first optical waveguide layer 121A (having a thickness of 0.5 µm) made of un-$In_{0.02}Ga_{0.98}N$, n-type second optical waveguide layer 122A (having a thickness of 0.03 µm) made of n-$Al_{0.026}Ga_{0.974}N$, n type third optical waveguide layer 123A (having a thickness of 0.22 µm) made of n-GaN, and fourth optical waveguide layer 124A (having a thickness of 0.02 µm) made of un-$In_{0.008}Ga_{0.992}N$ are stacked in the stated order.

Second conductivity side semiconductor layer 200A (p-side semiconductor layer) on active layer 300A includes p-side first semiconductor layer 210A, p-side second semiconductor layer 220A, p-side third semiconductor layer 230A, and p-side fifth semiconductor layer 250A.

P-side first semiconductor layer 210A is a p-type cladding layer, and is formed on p-side third semiconductor layer 230A. P-side first semiconductor layer 210A (having a total thickness of 0.595 µm) is a stacked film in which p-type first cladding layer 211A (having a thickness of 0.505 µm) made of p-$Al_{0.026}Ga_{0.974}N$, and p-type second cladding layer 212A (having a thickness of 0.09 µm) made of p-$Al_{0.026}Ga_{0.974}N$ and subjected to high-concentration doping are stacked in the stated order.

P-side second semiconductor layer 220A is an n-type current blocking layer made of n-$Al_{0.15}Ga_{0.85}N$ and having a thickness of 0.15 μm, and is formed on p-side first semiconductor layer 210A. Second semiconductor layer 220A has opening 221A corresponding to a current injection region. Opening 221A of second semiconductor layer 220A has a similar shape to opening 221 of second semiconductor layer 220 illustrated in FIG. 2, for example.

P-side third semiconductor layer 230A is a second light guiding layer that is a p-side light guiding layer, and is formed on active layer 300A. P-side third semiconductor layer 230A includes undoped light guiding layer 231A (having a thickness of 0.0354 μm), and carrier overflow inhibiting layer 232A (having a thickness of 0.0539 μm). Undoped light guiding layer 231A is a stacked film in which first optical waveguide layer 231Aa (having a thickness of 0.017 μm) made of un-$In_{0.008}Ga_{0.992}N$, p-type second optical waveguide layer 231Ab (having a thickness of 0.0135 μm) made of un-$In_{0.003}Ga_{0.997}N$, and p-type third optical waveguide layer 231Ac (having a thickness of 0.0049 μm) made of un-GaN are stacked in the stated order. Carrier overflow inhibiting layer 232A is a stacked film in which first carrier overflow inhibiting layer 232Aa (having a thickness of 0.0049 μm) made of p-GaN, second carrier overflow inhibiting layer 232Ab (having a thickness of 0.005 μm) made of p-$Al_{0.36}Ga_{0.64}N$, third carrier overflow inhibiting layer 232Ac (having a thickness of 0.044 μm) made of p-$Al_{0.026}Ga_{0.974}N$ are stacked in the stated order.

P-side fifth semiconductor layer 250A is formed on p-side second semiconductor layer 220A and p-side first semiconductor layer 210A, filling opening 221A of p-side second semiconductor layer 220A. P-side fifth semiconductor layer 250A is a p-type contact layer (having a thickness of 0.05 μm) made of p-GaN.

Active layer 300A is a stacked film having a double quantum well structure in which first barrier layer 310A (having a thickness of 0.019 μm) made of un-$In_{0.008}Ga_{0.992}N$, well layer 320A (having a thickness of 0.0075 μm) made of un-$In_{0.066}Ga_{0.934}N$, first barrier layer 310A (having a thickness of 0.019 μm) made of un-$In_{0.008}Ga_{0.992}N$, well layer 320A (having a thickness of 0.0075 μm) made of un-$In_{0.066}Ga_{0.934}N$, and second barrier layer 330A (having a thickness of 0.019 μm) made of n-$In_{0.008}Ga_{0.992}N$ are stacked in the stated order. Note that the composition of active layer 300A may be $In_xGa_{1-x}N$ (0≤x≤1). In this case, the luminous wavelength is in a range from 400 nm to 550 nm.

First electrode 103A (n-side electrode) and second electrode 104A (p-side electrode) are similar to first electrode 103 and second electrode 104 of semiconductor laser device 1 illustrated in FIG. 1, and current is supplied via first electrode 103A and second electrode 104A.

Although not illustrated, similarly to semiconductor laser device 1 illustrated in FIG. 2, the stacked structure included in semiconductor laser device 1A includes front end face 1a from which emitted laser light exits, rear end face 1b opposite front end face 1a, and an optical waveguide for which front end face 1a and rear end face 1b are used as reflection mirrors of a resonator.

Also in semiconductor laser device 1A according to this variation, the width of a current injection region for injecting current into an optical waveguide is defined by second semiconductor layer 220A (current blocking layer), similarly to semiconductor laser device 1 illustrated in FIG. 2. Specifically, the current injection region corresponds to opening 221A of second semiconductor layer 220A. Thus, also in this variation, the width of the current injection region is defined by the width of opening 221A of second semiconductor layer 220A, and opening widths S1 and S2 of opening 221A of second semiconductor layer 220A satisfy S1>S2.

FIG. 13 illustrates simulation results of a refractive index distribution in the stacking direction in an optical waveguide and a distribution of light confined in the optical waveguide, in semiconductor laser device 1A according to this variation.

As illustrated in FIG. 13, in semiconductor laser device 1A according to this variation, similarly to semiconductor laser device 1 according to Embodiment 1 above, the highest light intensity and most of the light distribution are present in n-side second semiconductor layer 120A (n-side light guiding layer). Accordingly, an optical waveguide which achieves low-loss, stable standing waves can be achieved.

As described above, semiconductor laser device 1A according to this variation yields advantageous effects similarly to semiconductor laser device 1 according to Embodiment 1 above.

Note that a GaAs substrate or a GaN substrate is used as substrate 101 in semiconductor laser devices 1 and 1A, but the substrate is not limited thereto. For example, an InP substrate is used as substrate 101, and layers of a stacked structure are formed on the InP substrate, using an arbitrarily selected semiconductor material such as GaAs, AlGaAs, AlGaAsP, InAlGaAsP, InP, GaInP, GaP, AlGaP, or InGaAsP, whereby similar advantageous effects can be yielded even if the InP substrate and such a stacked structure are included in the semiconductor laser device.

Embodiment 2

Figure 14:
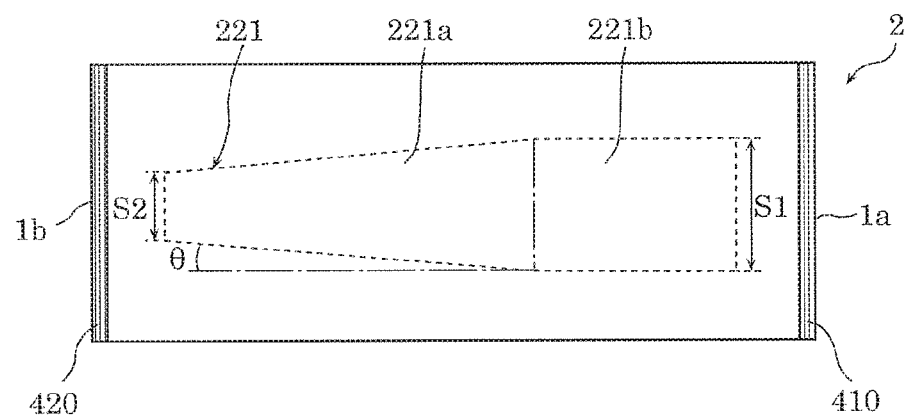
FIG. 14 is a plan view of a semiconductor laser device according to Embodiment 2.

The following describes semiconductor laser device 2 according to Embodiment 2 with reference to FIG. 14. FIG. 14 is a plan view of semiconductor laser device 2 according to Embodiment 2.

A difference between semiconductor laser device 2 according to the present embodiment and semiconductor laser device 1 according to Embodiment 1 above is the shape of the current injection region defined by second semiconductor layer 220 (current blocking layer), and in semiconductor laser device 2 according to the present embodiment, the current injection region includes a constant width region in which the width is constant, in addition to the width varying region in which the width varies.

Specifically, a difference between semiconductor laser device 2 according to the present embodiment and semiconductor laser device 1 according to Embodiment 1 above is the shape of opening 221 of second semiconductor layer 220 (current blocking layer), and a configuration other than the shape of the opening is the same for laser devices 1 and 2.

As illustrated in FIG. 14, in semiconductor laser device 2 according to the present embodiment, opening 221 of second semiconductor layer 220 (current blocking layer) includes opening width varying region 221a in which opening width varies, and opening width constant region 221b in which the opening width is constant.

Similarly to Embodiment 1, opening width S1 of opening width varying region 221a (width varying region) on the front end face 1a side and opening width S2 of opening width varying region 221a (width varying region) on the rear end face 1b side satisfy S1>S2.

Opening width constant region 221b is a linear region (straight stripe region) in which the width is constant. In the present embodiment, opening width constant region 221b is closer to front end face 1a than opening width varying region 221a is, and the width of opening width constant region 221b is the same as opening width S1 of opening width varying region 221a on the front end face 1a side.

Accordingly, a linear region (straight stripe region) of opening width constant region 221b is formed in a portion of opening 221 of second semiconductor layer 220, whereby the following influences are exerted on carrier distributions of electrons and holes depending on the order of a high-order optical transverse mode of light which propagates in an optical waveguide.

Specifically, second semiconductor layer 220 has opening width S2 narrower than opening width S1, and thus a high-order optical transverse mode cannot be guided (cut off) in the optical waveguide, and thus optical transverse modes guided in the optical waveguide decrease. This is similar to Embodiment 1 irrespective of whether the linear region is included in the optical waveguide, and even if a linear region is included in the optical waveguide, the order of an optical transverse mode is restricted by the width of the optical waveguide.

Here, if reflectance R1 of front end face 1a and reflectance R2 of rear end face 1b of semiconductor laser device 2 according to the present embodiment are set to values similar to reflectances R1 and R2 of semiconductor laser device 1 according to Embodiment 1, electrons and holes (carriers) consumed per unit time by stimulated emission become uneven in the longitudinal direction of the optical waveguide in active layer 300. Accordingly, spatial hole burning in the longitudinal direction occurs. As a result, unevenness of gains is caused, yet such unevenness is reduced similarly to Embodiment 1. Specifically, opening width varying region 221a which satisfies the relation S1>S2 is formed in opening 221 of second semiconductor layer 220, whereby light distribution can be extended toward front end face 1a so that light density in the region closer to front end face 1a spreads in the transverse direction and decreases. Therefore, light intensity distributions in the longitudinal direction and the transverse direction inside of the optical waveguide are made even.

In the present embodiment, opening width constant region 221b is formed in opening 221 of second semiconductor layer 220 on the front end face 1a side, and thus carriers can be injected into active layer 300 neither too much nor too little in the longitudinal direction of the optical waveguide, without generating spatial hole burning in the longitudinal direction. Thus, when the ratio of R1/R2 is extremely small, light intensity distribution in the longitudinal direction of the optical waveguide remarkably increases, it is difficult to completely inhibit the spatial hole burning in the longitudinal direction if opening 221 of second semiconductor layer 220 is formed only using a tapered region without a linear region as in Embodiment 1, yet opening 221 of second semiconductor layer 220 is formed using a combination of a tapered region and a linear region as in the present embodiment, thus completely preventing the spatial hole burning in the longitudinal direction.

Also in the present embodiment, similarly to Embodiment 1, if taper angle θ of opening width varying region 221a of opening 221 in second semiconductor layer 220 is excessively increased, taper loss $\alpha_{Taper}$ increases and threshold current increases, and also average slope efficiency decreases if taper angle θ is further increased. Accordingly, taper angle θ may satisfy 0°<θ≤0.5° also in the present embodiment, similarly to Embodiment 1. If taper angle θ satisfies this relational expression, taper loss $\alpha_{Taper}$ is prevented from exerting influence on the threshold current and slope efficiency.

Note that in the present embodiment, opening width constant region 221b of opening 221 in second semiconductor layer 220 is formed on the front end face 1a side of opening width varying region 221a, yet the present embodiment is not limited thereto.

Figure 15:
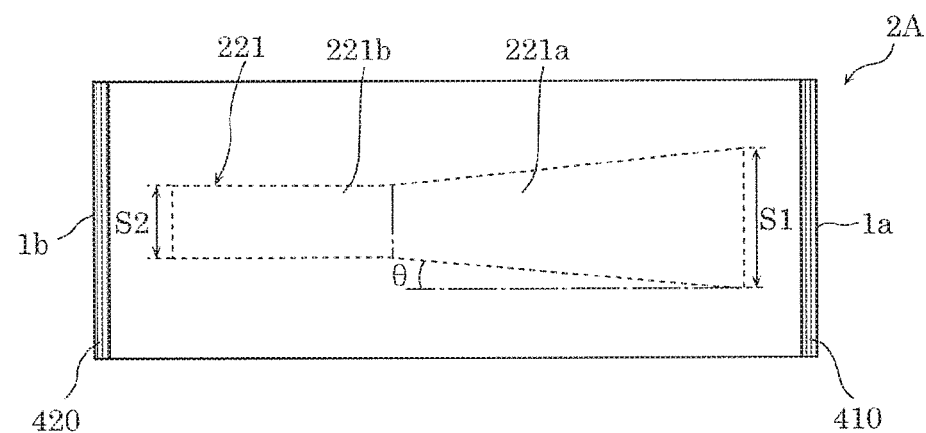
FIG. 15 is a plan view of a semiconductor laser device according to Variation 1 of Embodiment 2.

For example, as in semiconductor laser device 2A illustrated in FIG. 15, opening width constant region 221b (straight stripe region) of opening 221 of second semiconductor layer 220 may be formed on the rear end face 1b side of opening width varying region 221a. In this case, the opening width of opening width constant region 221b can be made the same as opening width S2 of opening width varying region 221a on the rear end face 1b side.

Accordingly, opening width constant region 221b is formed in opening 221 in second semiconductor layer 220 on the rear end face 1b side, and thus light which has a high-order optical transverse mode and propagates in the optical waveguide is limited by opening width S2 of opening width constant region 221b on the rear end face 1b side. Accordingly, the shape of the near field pattern (NFP) which indicates a field intensity distribution in the optical waveguide is stabilized, and light having a high-order optical transverse mode stably propagates in the optical waveguide. Thus, the unimodality of the shape of the far field pattern (FFP) of laser light can be stabilized.

Figure 16:
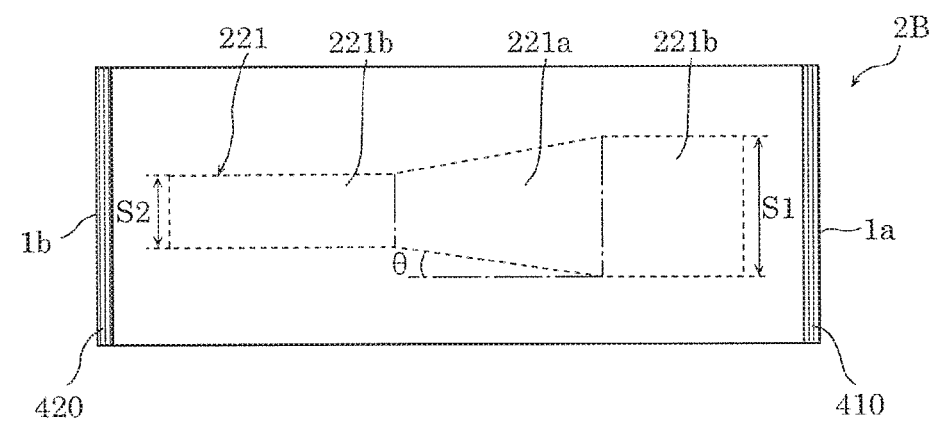
FIG. 16 is a plan view of a semiconductor laser device according to Variation 2 of Embodiment 2.

Furthermore, opening width constant region 221b (straight stripe region) of opening 221 in second semiconductor layer 220 may be formed on each of the front end face 1a side and the rear end face 1b side of opening width varying region 221a, as shown by semiconductor laser device 2B illustrated in FIG. 16. In this case, the opening width of opening width constant region 221b on the front end face 1a side is made the same as opening width S1 of opening width varying region 221a on the front end face 1a side, and the opening width of opening width constant region 221b on the front end face 1a side is made the same as opening width S2 of opening width varying region 221a on the rear end face 1b side.

Accordingly, advantageous effects yielded by both semiconductor laser device 2 in FIG. 14 and semiconductor laser device 2A in FIG. 15 can be achieved by forming opening width constant region 221b on each of the front end face 1a side and the rear end face 1b side of opening 221 of second semiconductor layer 220. Specifically, spatial hole burning in the longitudinal direction can be reduced when the ratio of R1/R2 is extremely low, and the shape of beams of laser light to be emitted can be stabilized.

Embodiment 3

Figure 17:
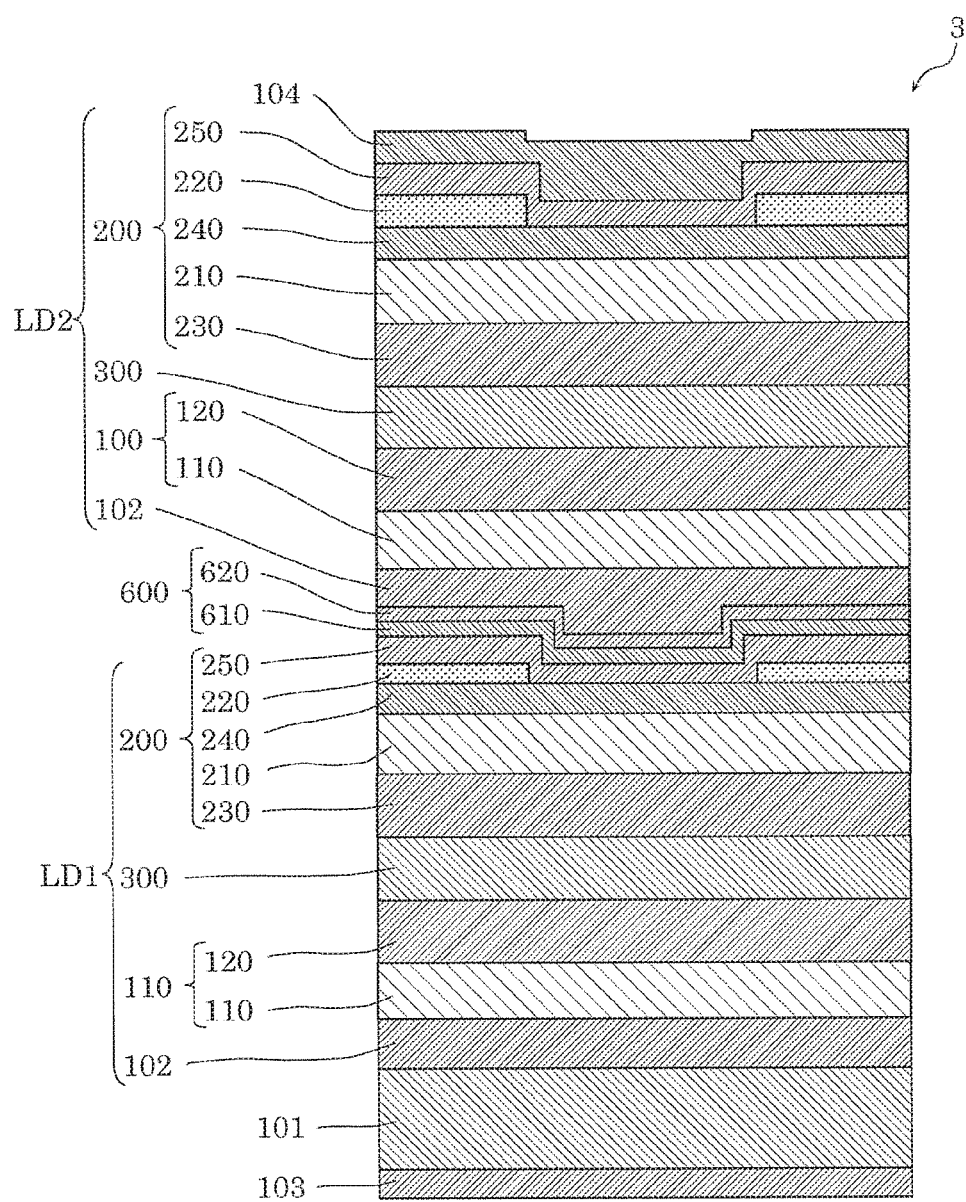
FIG. 17 is a cross-sectional view of a semiconductor laser device according to Embodiment 3.

The following describes semiconductor laser device 3 according to Embodiment 3, with reference to FIG. 17. FIG. 17 is a cross-sectional view of semiconductor laser device 3 according to Embodiment 3.

Semiconductor laser device 3 according to Embodiment 3 includes a plurality of stacked structures (laser structures) in semiconductor laser device 1 or 2 according to Embodiment 1 or 2, and has a structure (stack laser structure) in which the plurality of stacked structures are stacked in the stacking direction with a tunnel junction therebetween.

Specifically, semiconductor laser device 3 according to the present embodiment includes, as illustrated in FIG. 17, a double-stack structure in which two of the stacked structure of semiconductor laser device 1 in Embodiment 1 are stacked, and includes first laser structure LD1, second laser structure LD2, and tunnel junction layer 600 which connects first laser structure LD1 and second laser structure LD2 with a tunnel junction therebetween.

More specifically, semiconductor laser device 3 includes a stacked structure in which first laser structure LD1, tunnel junction layer 600, and second laser structure LD2 are stacked on substrate 101 which includes a GaAs substrate, first electrode 103 formed on the undersurface of substrate 101, and second electrode 104 formed on second laser structure LD2.

First laser structure LD1 and second laser structure LD1 are the same structures, and are each a stacked structure in which buffer layer 102, first conductivity side semiconductor layer 100, active layer 300, and second conductivity side semiconductor layer 200 are stacked, similarly to the stacked structure of semiconductor laser device 1 according to Embodiment 1.

Tunnel junction layer 600 is a stacked film which includes first tunnel junction layer 610 which is a p-type layer subjected to high concentration doping, and second tunnel junction layer 620 which is an n-type layer subjected to high concentration doping and formed on first tunnel junction layer 610.

Figure 18:
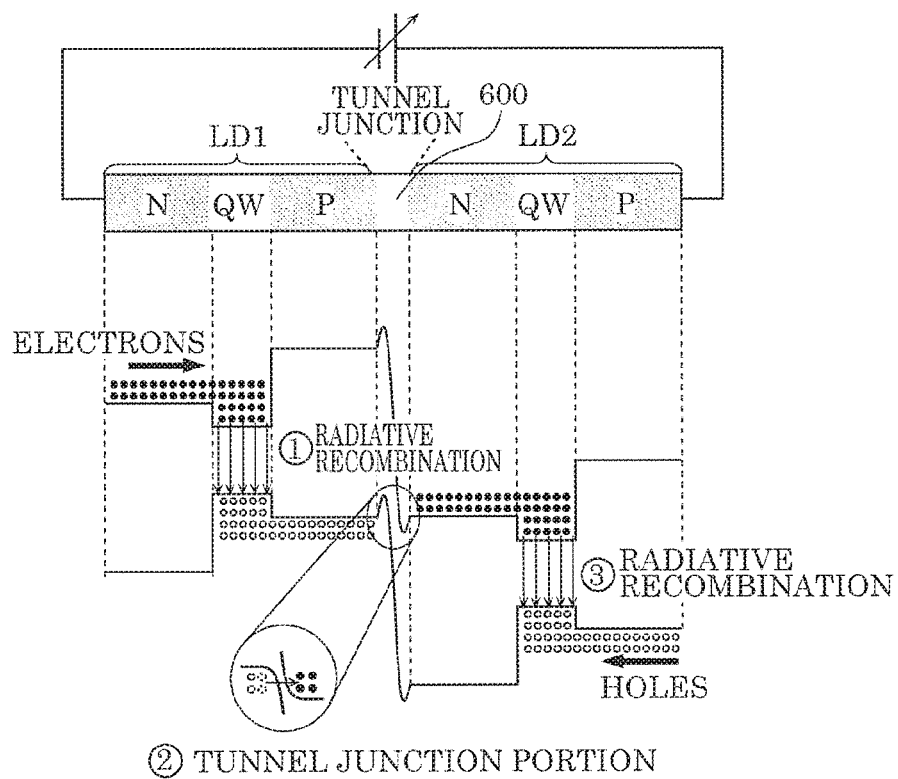
FIG. 18 schematically illustrates movement of carriers (electrons and holes) injected when a forward bias is applied to the semiconductor laser device according to Embodiment 3.

Semiconductor laser device 3 having such a configuration emits light, as illustrated in FIG. 18. FIG. 18 schematically illustrates movement of carriers (electrons and holes) injected when a forward bias is applied to semiconductor laser device 3 according to the present embodiment. As illustrated in FIG. 18, injected electrons generate photons by radiative recombination in first laser structure LD1. Next, electrons are injected via tunnel junction layer 600 into second laser structure LD2. Next, photons are generated by radiative recombination in second laser structure LD2. Specifically, photons are generated twice in semiconductor laser device 3 having the double-stack structure, and thus luminous efficacy doubles. Note that although not illustrated, a semiconductor laser device having a triple-stack structure generates photons three times, and thus luminous efficacy triples.

Next, semiconductor laser device 3 was actually produced similarly to Embodiment 1, and the characteristics of the semiconductor laser device were evaluated.

In this case, openings 221 of second semiconductor layers 220 in first laser structure LD1 and second laser structure LD2 have the tapered shape as illustrated in FIG. 2, and S1=105 μm and S2=50 μm.

Tunnel junction layer 600 needs to be formed such that in order to allow operation in the tunnel junction portion, first tunnel junction layer 610 and second tunnel junction layer 620 are joined such that there is a sharp band cap at the interface therebetween, and an impurity doping profile for tunnel junction layer 610 and second tunnel junction layer 620 shows sharpness at the joining interface.

In view of this, in the present embodiment, first tunnel junction layer 610 is a p-type GaAs layer (having a thickness of 25 nm) doped with $1 \times 10^{19}$ cm$^3$ of carbon (C) as an impurity, and second tunnel junction layer 620 is an n-type GaAs layer (leaving a thickness of 25 nm) doped with $5 \times 10^{18}$ cm$^3$ of silicon (Si) as an impurity.

This is because if zinc (Zn) is selected as a material to be thermally diffused, the doping profile at the interface between first tunnel junction layer 610 and second tunnel junction layer 620 is dull due to thermal diffusion of Zn, and the tunnel voltage at the tunnel junction portion becomes very high. Carbon (C) and silicon (Si) are impurities which are hardly thermally diffused, and thus carbon (C) is used as an impurity material for first tunnel junction layer 610, and silicon (Si) is used as an impurity material for second tunnel junction layer 620. Accordingly, the doping profile can be inhibited from being dull at the interface between first tunnel junction layer 610 and second tunnel junction layer 620, due to thermal diffusion of the impurities.

When a forward bias is applied, the tunnel voltage necessary for carriers to tunnel through the tunnel junction portion of tunnel junction layer 600 changes according to how a depletion layer in the tunnel junction portion is formed which depends on the impurity concentration and the thickness of first tunnel junction layer 610 and the impurity concentration and the thickness of second tunnel junction layer 620. Accordingly, as described above, first tunnel junction layer 610 has an impurity concentration of carbon (C) of $1 \times 10^{19}$ cm$^3$, and a thickness of 25 nm. Second tunnel junction layer 620 has an impurity density of silicon (Si) of $5 \times 10^{18}$ cm$^3$, and a thickness of 25 nm. The result showed that operation can be carried out at a rise voltage of 0.5V which is the lowest tunnel voltage.

A rise voltage indicated by current-voltage characteristics is 1.2V at pn junctions of first laser structure LD1 and second laser structure LD2. Accordingly, the operating voltage indicated by the current-voltage characteristics of semiconductor laser device 3 having the double-stack structure is 2.9V which is a voltage obtained by adding a tunnel voltage (0.5V) and a rise voltage (1.2V×2) of first laser structure LD1 and second laser structure LD2. Actually produced semiconductor laser device 3 was caused to operate, and it was confirmed that semiconductor laser device 3 operated at 2.9V which is the lowest tunnel voltage.

Figure 19:
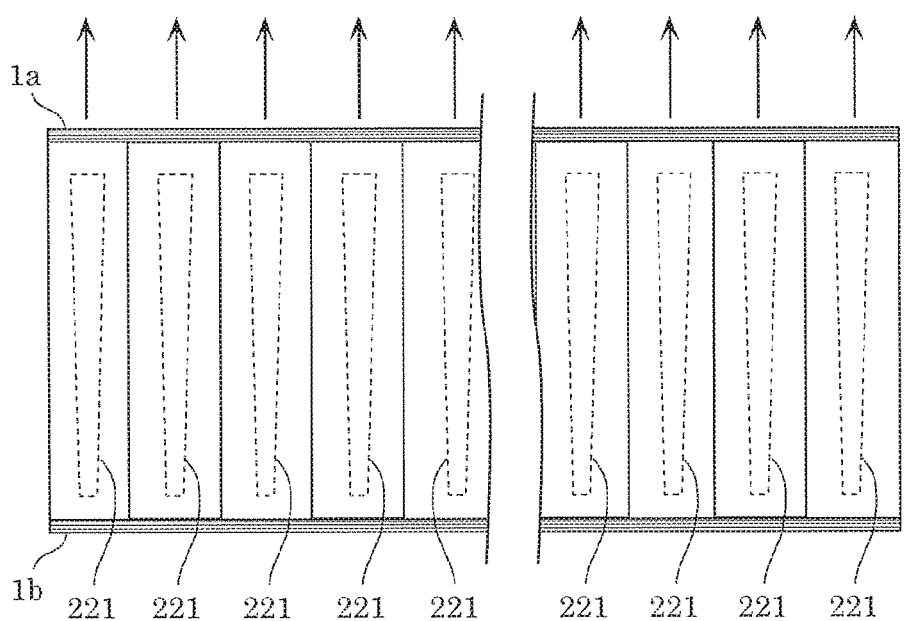
FIG. 19 is a plan view illustrating a configuration of a semiconductor laser device according to an example of Embodiment 3.

Next, the current-light output characteristics of actually produced semiconductor laser device 3 having the double-stack structure were checked. In this case, in order to check current-light output characteristics, a semiconductor laser element having a multi-emitter structure was produced which had two stacked structures in each of which 20 openings 221 are formed in second semiconductor layer 220 parallel to each other in the lengthwise direction of the optical waveguide, similarly to Embodiment 1. FIG. 19 is a plan view illustrating a configuration of a semiconductor laser device according to an example of Embodiment 3, and schematically illustrates the actually produced multi-emitter structure.

Similarly to FIG. 8B, the current-light output characteristics of actually produced semiconductor laser device 3 having a double-stack structure were obtained, and the threshold current was 11.9 A which is the same as the value in FIG. 8B, and the average slope efficiency was 2.42 W/A. Thus, it was confirmed that semiconductor laser device 3 was operating with twice the average slope efficiency (1.21 W/A×2).

This result has shown that the spatial hole burning in the longitudinal direction and the transverse direction is inhibited and the injection efficiency of carriers is improved by openings 221 of second semiconductor layer 220 also in the semiconductor laser device having the double-stack structure (stacked laser structure), similarly to Embodiment 1, and it was confirmed that in a semiconductor laser device which produces multi-transverse mode oscillation, the injection efficiency of carriers (electrons and holes) in the longitudinal direction of the optical waveguide can be improved with respect to the light intensity (field intensity) in the optical waveguide.

As described above, semiconductor laser device 3 according to the present embodiment can yield advantageous effects similar to those yielded by semiconductor laser device 1 according to Embodiment 1. Accordingly, a high-output semiconductor laser device which can be driven at a low voltage can be achieved while inhibiting occurrence of COD.

Note that although two laser structures are stacked in the present embodiment, the number thereof is not limited to two, and similar advantageous effects can be produced by stacking three or more laser structures.

Embodiment 4

Figure 20A:
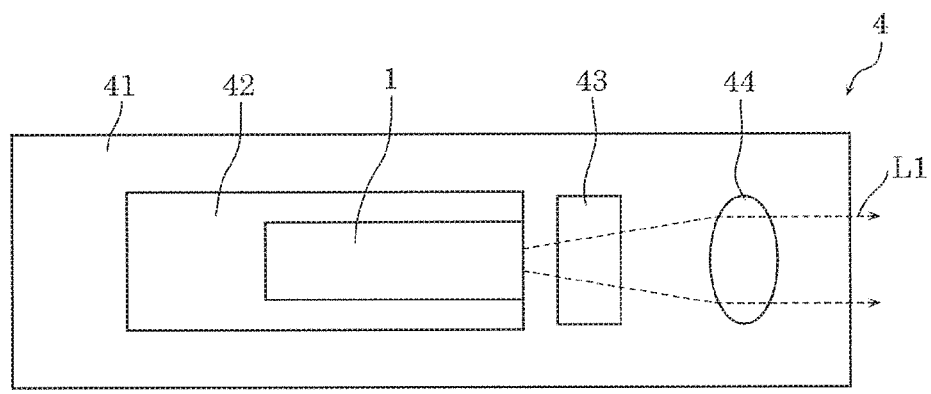
FIG. 20A is a plan view of a semiconductor laser module according to Embodiment 4.
Figure 20B:
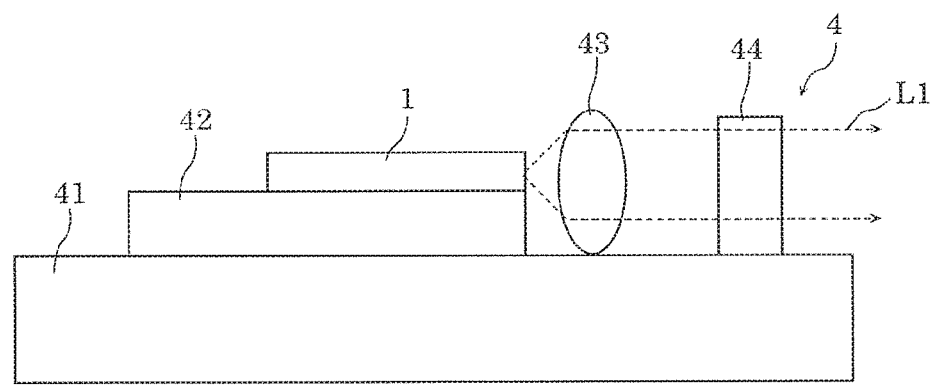
FIG. 20B is a side view of the semiconductor laser module according to Embodiment 4.

The following describes a semiconductor laser module according to Embodiment 4, with reference to FIGS. 20A and 20B. FIG. 20A is a plan view of semiconductor laser module 4 according to Embodiment 4, and FIG. 20B is a side view of semiconductor laser module 4.

Semiconductor laser module 4 according to the present embodiment includes semiconductor laser device 1 according to Embodiment 1 above. Specifically, as illustrated in FIGS. 20A and 20B, semiconductor laser module 4 includes metal base 41, base 42 disposed on metal base 41, semiconductor laser device 1 disposed on base 42, and first optical element 43 and second optical element 44 which are disposed on the path of laser light L1 emitted by semiconductor laser device 1.

In semiconductor laser device 1, carriers leak from the active layer due to generated heat, thus decreasing the heat saturation level. Semiconductor laser device 1 is susceptible to the influence of external force, and if an excessive stress is applied from the outside, the crystallinity of the semiconductor material deteriorates, which results in a decrease in long term reliability. Gold tin solder is usually used to mount the semiconductor laser device, and thus the semiconductor laser device is mounted under a high temperature state in which gold tin solder is about to melt. Accordingly, if the semiconductor laser device is mounted on a material having a thermal expansion coefficient greatly different from that of the semiconductor laser device, a heating-cooling process generates a mounting stress due to the difference in thermal expansion coefficient, which is to be applied to the semiconductor laser device. In the present embodiment, in view of the above, base 42 having high heat conductivity and a grating constant close to the grating constant of the semiconductor material used for semiconductor laser device 1 is disposed on metal base 41 which highly dissipates heat, and then semiconductor laser device 1 is mounted on base 42.

Metal base 41 may be made of copper, for example. Base 42 may be made of a material having a grating constant close to the grating constant of semiconductor laser device 1, examples of which include a material made of copper and tungsten, a material made of copper, tungsten, and diamond, and a material made of aluminum nitride. A channel through which a liquid circulates may be formed inside metal base 41. Accordingly, heat dissipation can be further improved by circulating cooling water in the channel, and thus semiconductor laser device 1 can be caused to operate to make high output, and also a mounting stress applied to semiconductor laser device 1 is reduced, thus securing long term reliability.

First optical element 43 collimates only light in the longitudinal direction, out of laser light L1 emitted by semiconductor laser device 1. Second optical element 44 collimates light in the transverse direction, out of laser light L1 which includes the light in the longitudinal direction collimated by passing through first optical element 43. This configuration avoids the distance from semiconductor laser device 1 exerting influence on the shape of laser light L1. Accordingly, this achieves semiconductor laser module 4 which can efficiently use laser light L1 emitted by semiconductor laser device 1.

As described above, semiconductor laser module 4 according to the present embodiment includes semiconductor laser device 1 according to Embodiment 1, and thus a high-output semiconductor laser module which can perform low-power operation.

Note that semiconductor laser device 1 according to Embodiment 1 is used in the present embodiment, yet the present embodiment is not limited thereto. For example, semiconductor laser device 2 according to Embodiment 2 or semiconductor laser device 3 according to Embodiment 3 may be used. In this case, the semiconductor laser device may have a multi-emitter structure which includes a plurality of emitters. The light output from the semiconductor laser module can be further increased by using the semiconductor laser device having a multi-emitter structure.

Embodiment 5

Figure 21:
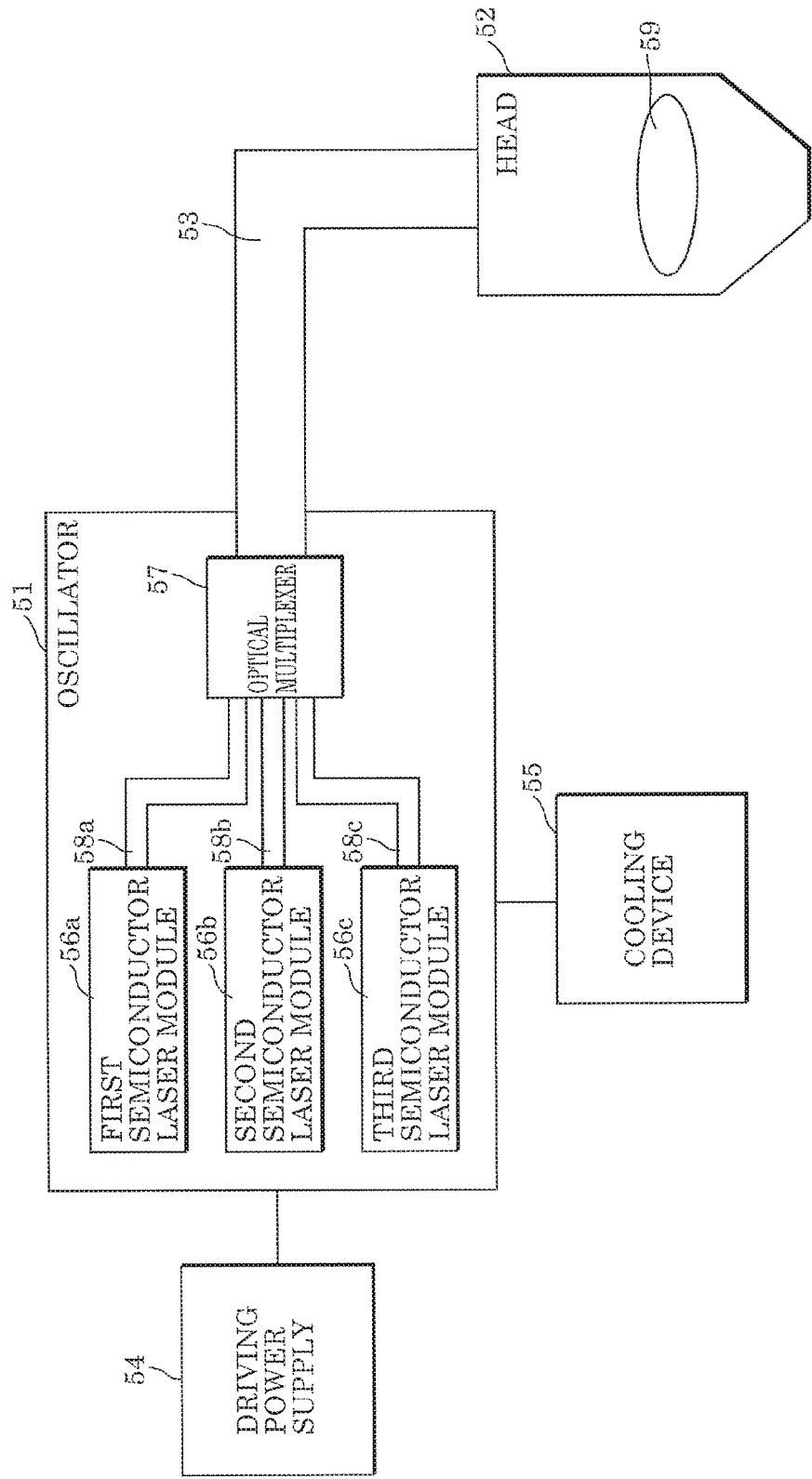
FIG. 21 illustrates a configuration of a laser light source system for welding according to Embodiment 5.

The following describes laser light source system 5 for welding according to Embodiment 5 with reference to FIG. 21. FIG. 21 illustrates a configuration of laser light source system 5 for welding according to Embodiment 5.

As illustrated in FIG. 21, laser light source system 5 for welding includes oscillator 51, head 52, light path 53 between oscillator 51 and head 52, driving power supply 54 for driving oscillator 51, and cooling device 55 for cooling oscillator 51.

Oscillator 51 includes first semiconductor laser module 56a, second semiconductor laser module 56b, third semiconductor laser module 56c, optical multiplexer 57, and first to third light paths 58a to 58c provided between optical multiplexer 57 and first to third semiconductor laser modules 56a to 56c. First to third semiconductor laser modules 56a to 56c, are semiconductor laser modules 4 according to Embodiment 4, for example. Accordingly, laser light source system 5 for welding includes a semiconductor laser device which emits laser light, as a light source.

Head 52 includes optical element 59. Optical element 59 is, for instance, a convex lens having a light concentrating function, for example.

First to third semiconductor laser modules 56a to 56c of oscillator 51 receives power supply from driving power supply 54, and output collimated laser light.

Three laser light beams output from first to third semiconductor laser modules 56a to 56c pass through first light path 58a, second light path 58b, and third light path 58c, respectively, and are guided to optical multiplexer 57. First to third light paths 58a to 58c can be achieved using, for example, optical elements such as optical fibers or reflection mirrors.

Optical multiplexer 57 has a function for multiplexing the three laser light beams guided along first to third light paths 58a to 58c into a light beam that travels along a single light path. Optical multiplexer 57 can be achieved using, for instance, a multiplexing prism or a diffraction grating, for example. Optical multiplexer 57 simplifies light path 53 to head 52 even when a plurality of semiconductor laser modules are included.

Light path 53 can be achieved by an optical element such as an optical fiber or a reflection mirror, similarly to first to third light paths 58a to 58c. When laser light source system 5 for welding has a configuration in which head 52 is fixed, light path 53 may be achieved by an optical element such as a reflection mirror. When laser light source system 5 for welding has a configuration in which head 52 is movably included, light path 53 may be achieved by an optical fiber.

Optical element 59 of head 52 causes laser light guided from oscillator 51 via light path 53 to concentrate at one point. This allows laser light from semiconductor laser devices included in first to third semiconductor laser modules 56*a* to 56*c* to be directly emitted onto a welding object with high light density. Furthermore, laser light from the semiconductor laser devices can be directly used, and thus the wavelength of laser light to be used can be readily changed by changing the semiconductor laser devices. Accordingly, the wavelength according to the light absorption rate of an object to be welded can be selected, thus increasing the efficiency of the welding process.

As described above, laser light source system 5 for welding according to the present embodiment includes the semiconductor laser modules each of which includes semiconductor laser device 1 according to Embodiment 1, and thus a high-output laser light source system for welding which can perform low-power operation can be achieved.

Note that first to third semiconductor laser modules 56*a* to 56*c* used in the present embodiment each include semiconductor laser device 1 according to Embodiment 1, yet the present embodiment is not limited thereto. For example, first to third semiconductor laser modules 56*a* to 56*c* may each include semiconductor laser device 2 or 3 according to Embodiment 2 or 3. In this case, a semiconductor laser device having a multi-emitter structure which includes a plurality of emitters may be included.

The laser light source system for welding according to the present embodiment includes three semiconductor laser modules, yet the present embodiment is not limited thereto. In this case, higher light output can be obtained by increasing the number of semiconductor laser modules included.

Laser light source system 5 for welding according to the present embodiment can also be achieved as a laser welding device in a laser welding facility, for instance.

In the present embodiment, light path 53 is achieved by an amplification optical fiber having an optical fiber core to which rare earth is added, and fiber bragg gratings (FBGs) having a function for confining light in the amplification optical fiber are provided at the ends of the amplification optical fiber, whereby a fiber laser welding device can be achieved which uses light amplified by the amplification optical fiber as light from a light source for welding.

Variation

The above has described, for instance, the semiconductor laser device, the semiconductor laser module, and the laser light source system for welding according to the present disclosure based on the embodiments, yet the present disclosure is not limited to Embodiments 1 to 5 above.

For example, in Embodiments 1 and 2 above, the current injection region defined by second semiconductor layer 220 (current blocking layer) has a shape symmetrical with respect to the center line in the longitudinal direction of the optical waveguide in the current injection region, but may have asymmetrical shape as long as taper angle θ is in a range which satisfies Expression (d).

The present disclosure also includes embodiments as a result of adding various modifications that may be conceived by those skilled in the art to the embodiments, and embodiments obtained by combining elements and functions in the embodiments in any manner as long as the combination does not depart from the spirit of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor laser device according to the present disclosure can perform high-output and low-power operation, and thus is useful as, for example, a welding light sources, projector light sources, display light sources, illumination light sources, and light sources used for other electronic devices and information processing devices, for instance.

What is claimed is:

1. A semiconductor laser device which produces multi-transverse mode oscillation, the semiconductor laser device comprising:
   a stacked structure in which a first conductivity side semiconductor layer, an active layer, and a second conductivity side semiconductor layer are stacked in stated order, wherein:
   the stacked structure includes:
      a front end face from which laser light emitted by the semiconductor laser device exits;
      a rear end face opposite, in a lengthwise direction, to the front end face;
      an optical waveguide for which the front end face and the rear end face are used as reflection mirrors of a resonator; and
      a current injection region for injecting current into the optical waveguide,
   the second conductivity side semiconductor layer includes a first semiconductor layer and a second semiconductor layer, the first semiconductor layer being closer to the active layer than the second semiconductor layer is,
   the second semiconductor layer defines a width of the current injection region,
      the current injection region includes a first end portion on a front end face side closer to the front end face and a second end portion on a rear end face side closer to the rear end face in the lengthwise direction, the first end portion of the current injection region is spaced apart from the front end face, and the second end portion of the current injection region is spaced apart from the rear end face,
   the current injection region includes a width varying region in which a width varies,
   S1>S2, where S denotes a width of the width varying region on a front end face side closer to the front end face, and S2 denotes a width of the width varying region on a rear end face side closer to the rear end face,
   the first conductivity side semiconductor layer includes a first light guiding layer,
   the laser light emitted by the semiconductor laser device has a highest intensity in the first light guiding layer,
   the second conductivity side semiconductor layer includes a second light guiding layer between the active layer and the first semiconductor layer,
   the first semiconductor layer is a second conductivity side cladding layer, the second semiconductor layer is a current blocking layer, the second light guiding layer includes a first optical waveguide layer that is undoped, and a p-type second optical waveguide layer, the first optical waveguide layer being closer to the active layer than the p-type second optical waveguide layer is, and the first optical waveguide layer has an Al concentration lower than an Al concentration of the p-type second optical wave guide layer.

2. The semiconductor laser device according to claim 1, wherein
the stacked structure has a window-mirror structure on each of the front end face side and the rear end face side.

3. The semiconductor laser device according to claim 1, wherein
a thickness of the first semiconductor layer in a region under the current injection region is same as a thickness of the first semiconductor layer in a region under the second semiconductor layer.

4. The semiconductor laser device according to claim 1, wherein
$0° < \theta \leq 0.5°$, where $\theta$ denotes an angle between the lengthwise direction of the resonator and a straight line which connects a widthwise end of the width varying region on the front end face side and a widthwise end of the width varying region on the rear end face side.

5. The semiconductor laser device according to claim 4, wherein
$0.238 \leq S2/S1 \leq 0.476$, where S1 denotes the width of the width varying region on the front end face side, and S2 denotes the width of the width varying region on the rear end face side.

6. The semiconductor laser device according to claim 1, wherein
the width varying region has a tapered shape defined by straight lines which connect widthwise ends on the front end face side to widthwise ends on the rear end face side.

7. The semiconductor laser device according to claim 1, wherein
the second semiconductor layer has an opening corresponding to the current injection region.

8. The semiconductor laser device according to claim 7, wherein
the stacked structure includes a second conductivity side contact layer stacked on the second semiconductor layer, and
the second conductivity side contact layer fills the opening.

9. The semiconductor laser device according to claim 1, wherein
the active layer has a single quantum well structure.

10. The semiconductor laser device according to claim 1, wherein
the first conductivity side semiconductor layer includes a first conductivity side cladding layer,
the first conductivity side cladding layer and the second conductivity side cladding layer have a composition represented by $Al_xGa_{1-x}As$, where $0<x<1$, at least one of the first conductivity side cladding layer and the second conductivity side cladding layer includes a stacked film which includes two or more layers having different Al ratios, and among the two or more layers in the stacked film, a layer having a lower Al concentration is more distant from the active layer.

11. The semiconductor laser device according to claim 1, wherein
the first light guiding layer has a composition represented by $Al_xGa_{1-x}As$, where $0<x<1$,
the first light guiding layer includes a stacked film which includes two or more layers having different Al ratios, and
among the two or more layers in the stacked film, a layer having a lower Al concentration is closer to the active layer.

12. The semiconductor laser device according to claim 1, wherein
the first conductivity side semiconductor layer includes a first conductivity side cladding layer, and
the first conductivity side cladding layer, the second conductivity side cladding layer, and the active layer are each made of an $Al_xGa_{1-x-y}In_yN$ based material, where $0 \leq x \leq 1$ and $0 \leq y \leq 1$.

13. The semiconductor laser device according to claim 1, further comprising:
a plurality of stacked structures each of which is the stacked structure, wherein
the plurality of stacked structures are stacked with one or more tunnel junctions therebetween.

14. The semiconductor laser device according to claim 1, wherein
the width of the width varying region on the front end face side is a width of the current injection region on the front end face side, and
the width of the width varying region on the rear end face side is a width of the current injection region on the rear end face side.

15. The semiconductor laser device according to claim 1, wherein
the current injection region further includes a constant width region in which a width is constant.

16. The semiconductor laser device according to claim 15, wherein
the constant width region is closer to the front end face than the width varying region is.

17. A semiconductor laser module, comprising:
the semiconductor laser device according to claim 1.

18. A laser light source system for welding, comprising:
the semiconductor laser device according to claim 1.

19. The semiconductor laser device according to claim 1, wherein the first end portion of the current injection region is spaced apart from the front end face by a first part of the second semiconductor layer, and the second end portion of the current injection region is spaced apart from the rear end face by a second part of the second semiconductor layer.

* * * * *